US011379306B1

(12) United States Patent
Ross et al.

(10) Patent No.: US 11,379,306 B1

(45) Date of Patent: Jul. 5, 2022

(54) METHOD FOR RADIATION HARDENING SYNCHRONOUS DRAM

(71) Applicant: BAE SYSTEMS Information and Electronic Systems Integration Inc., Nashua, NH (US)

(72) Inventors: Jason F. Ross, Haymarket, VA (US); John Foster, Falls Church, VA (US); David M. Hutcheson, Brightwood, VA (US)

(73) Assignee: BAE Systems Information and Electronic System Integration Inc., Nashua, NH (US)

( * ) Notice: Subject to any disclaimer, the term of this patent is extended or adjusted under 35 U.S.C. 154(b) by 0 days.

(21) Appl. No.: 17/388,690

(22) Filed: Jul. 29, 2021

(51) Int. Cl.

| | |
|---|---|
| ***G06F 11/00*** | (2006.01) |
| ***G06F 11/10*** | (2006.01) |
| ***H03M 13/29*** | (2006.01) |
| ***G11C 11/4096*** | (2006.01) |
| ***G11C 11/419*** | (2006.01) |
| ***G11C 11/418*** | (2006.01) |
| ***G01R 31/3177*** | (2006.01) |

(52) U.S. Cl.

CPC ...... *G06F 11/1068* (2013.01); *G01R 31/3177* (2013.01); *G11C 11/4096* (2013.01); *G11C 11/418* (2013.01); *G11C 11/419* (2013.01); *H03M 13/2906* (2013.01)

(58) Field of Classification Search

None

See application file for complete search history.

(56) References Cited

U.S. PATENT DOCUMENTS

| | | | | |
|---|---|---|---|---|
| 4,937,756 A * | 6/1990 | Hsu | H01L 21/765 | 438/953 |
| 5,713,006 A * | 1/1998 | Shigeeda | G06F 1/1616 | 711/E12.089 |
| 6,418,068 B1 * | 7/2002 | Raynham | G11C 29/76 | 714/E11.034 |
| 6,493,789 B2 * | 12/2002 | Ware | G11C 7/22 | 365/189.04 |

(Continued)

FOREIGN PATENT DOCUMENTS

EP 2437267 A2 4/2012

OTHER PUBLICATIONS

P. Chen et al., "An Enhanced EDAC Methodology for Low Power PSRAM," 2006 IEEE International Test Conference, 2006, pp. 1-10, doi: 10.1109/TEST.2006.297689. (Year: 2006).*

*Primary Examiner* — Daniel F. McMahon

(74) *Attorney, Agent, or Firm* — Maine Cernota & Rardin

(57) ABSTRACT

A method for radiation hardening synchronous Dynamic Random Access Memory (DRAM), where Error Detection And Correction (EDAC) is implemented on-chip. Each bank includes a plurality of interleaved single chip Static Random Access Memory (SRAM) cells with bit registers configured to interface with the interleaved SRAM cells. A first column multiplexer (MUX) configured to select which bit register is accessed. A second column multiplexer is configured to select an accessed byte with the WRITE burst or a READ burst from the selected bit registers of the first column multiplexer. EDAC logic is configured to check Error Correction Code (ECC) during a READ burst and generate ECC during an WRITE burst for SRAM writeback during a PRECHARGE command.

20 Claims, 22 Drawing Sheets

PRIOR ART SINGLE CHIP MEMORY

(56) References Cited

U.S. PATENT DOCUMENTS

| | | | | |
|---|---|---|---|---|
| 6,826,105 | B2 | 11/2004 | Wang et al. | |
| 2003/0093744 | A1* | 5/2003 | Leung | G06F 11/1048 714/E11.049 |
| 2005/0040546 | A1* | 2/2005 | Cuchiaro | G11C 11/4125 257/E27.099 |
| 2005/0114639 | A1* | 5/2005 | Zimmer | G06F 9/4401 712/244 |
| 2008/0195894 | A1* | 8/2008 | Schreck | G06F 11/106 711/155 |
| 2008/0203443 | A1* | 8/2008 | Wilson | H01L 27/11585 257/295 |
| 2017/0109232 | A1* | 4/2017 | Cha | G06F 3/0619 |
| 2018/0261300 | A1* | 9/2018 | Shimizu | G11C 29/42 |
| 2018/0285192 | A1* | 10/2018 | Merl | G06F 11/0736 |
| 2018/0358060 | A1* | 12/2018 | Cha | G11C 7/106 |
| 2021/0064462 | A1* | 3/2021 | Eun | G11C 29/4401 |
| 2021/0311822 | A1* | 10/2021 | Jannusch | G06F 11/1032 |

* cited by examiner

100

PRIOR ART DRAM MEMORY ELEMENT

200

PRIOR ART SRAM MEMORY ELEMENT

300

PRIOR ART SDRAM CHIP ARCHITECTURE

400

PRIOR ART SDR SDRAM BANK ARCHITECTURE

500A

PRIOR ART 64 Mb SDR SDRAM ROW ARCHITECTURE

500B

PRIOR ART 64 Mb SDR SDRAM COLUMN ARCHITECTURE

600

PRIOR ART TRIPLE MODULAR REDUNDANT DFF

700

PRIOR ART DFF WITH SINGLE EVENT TRANSIENT FILTER

PRIOR ART SINGLE CHIP MEMORY

900A

PRIOR ART 64 Mb SDR SDRAM PHYSICAL BIT SEPARATION
4 MEG X 4 X 4 BANKS

900B

64 Mb SDR SDRAM PHYSICAL BIT SEPARATION
4 MEG X 4 X 4 BANKS

1000A

PRIOR ART SDR SDRAM READ / WRITE BLOCK DIAGRAM

SDR SDRAM READ / WRITE BLOCK DIAGRAM

SINGLE CHIP BANK ARCHITECTURE

SINGLE CHIP 512Mb DDR3L - BANK ARCHITECTURE

1300

SINGLE CHIP 512Mb DDR3L BANK ARCHITECTURE

SINGLE CHIP DATA FLOW

SINGLE CHIP – 512Mb DDR3L READ DATA FLOW

SINGLE CHIP – 512Mb DDR3L – WRITE DATA FLOW

1700

64Mb SDR SDRAM BANK ARCHITECTURE

WRITE METHOD

READ METHOD

METHOD FOR RADIATION HARDENING SYNCHRONOUS DRAM

STATEMENT OF GOVERNMENT INTEREST

This invention was made with Government support under Contract Number FA9453-19-C-0009 awarded by the U.S. Air Force. The United States Government has certain rights in the inventions.

FIELD OF THE DISCLOSURE

The invention relates to semiconductor memory devices, and, more particularly, to a device, system, and method for radiation hardening Synchronous Dynamic Random Access Memory (SDRAM).

BACKGROUND

Commercial Off-The-Shelf (COTS) Synchronous Dynamic Random Access Memory (SDRAM) memory parts have multiple functional and reliability issues operating in radiation environments. There are currently no satisfactory solutions, and current systems use up-screened (screened to military equivalents) COTS parts which tend to have these reliability and performance issues in harsh environments.

There are multiple types of high energy particles that create radiation effects in integrated circuits such as alpha particles, neutrons, protons, electrons, and heavy ions. These high energy particles strike the semiconductor material with enough energy to cause the generation of electron-hole pairs. The resulting charge carriers may be trapped in the various oxide layers of the memory devices (Total Ionizing Dose) or compromise the integrity of the stored data (Single-Event Upset). Radiation effects in DRAMs include Total Ionizing Dose (TID), Single-Event Latchup (SEL), Single-Event Upset (SEU), Single-Event Functional Interrupt (SEFI), and Stuck Bits. TID can cause an increase in the leakage current of the n-channel MOSFET used in the DRAM memory cell which will reduce the data retention time and ultimately lead to functional failures. SEL can cause a localized high current condition inside the chip and result in loss of all data stored on chip due to the need to power cycle the device to recover from the event. In extreme cases, SEL may cause physical damage to the chip due to localized self-heating. SEU can occur hundreds of times per day, multi-bit upsets a few times per day per chip and can result in system errors due to erroneous data. SEFI results in the loss of chip functionality, and power cycling (losing all data on the chip) is usually necessary for recovery. Stuck Bits cause temporary or permanent loss of functionality of a single memorybit, impairing reliability and error detection performance. Furthermore, error/failure rates can vary by more than ten times between manufacturing lots which creates significant radiation assurance challenges.

FIG. 1 depicts a prior art dynamic random access memory (DRAM) memory element 100. The DRAM memory element 100 includes an n-channel MOSFET 102 in electrical communication with a capacitor 104 which is in further electrical communication with circuit ground. The n-channel MOSFET 102 is in further electrical communication with a Word Line 108 input signal and a bidirectional Bit Line 106 signal.

The state of the DRAM memory element 100 is determined by the amount of charge stored on the capacitor 104. The charge stored on the capacitor 104 is valid for a specified time duration, referred to as the retention time, due to losses caused by leakage currents in the n-channel MOSFET 102 and capacitor 104. This phenomenon requires the DRAM memory element 100 to be periodically refreshed to retain the logic state. Furthermore, the leakage currents in the n-channel MOSFET 102 and capacitor 104 increase with temperature which reduces retention time and effectively limits the operating temperature range. Similarly, the leakage current of the n-channel MOSFET 102 increases with total ionizing dose (TID) radiation which leads to functional data retention failures.

To store a logic0 in the DRAM memory element 100, the Bit Line 106 signal is driven to logic0 while the Word Line 108 signal is driven to logic1 which removes any charge stored on the capacitor 104. To store a logic1 in the DRAM memory element 100, the Bit Line 106 signal is driven to logic1 while the Word Line 108 signal is driven to logic1 which stores charge on the capacitor 104. In most modern DRAM designs, the Word Line 108 signal is driven to an elevated voltage, typically generated by an on-die charge pump circuit, to maximize the amount of charge stored on the capacitor 104 when writing through the n-channel MOSFET 102. The elevated voltage level used to drive the Word Line 108 signal increases susceptibility to single-event gate rupture (SEGR) and single-event latchup (SEL) radiation effects due to higher electric fields.

To read the state of the DRAM memory element 100, the Bit Line 106 is pre-charged to an intermediate voltage and then the Word Line 108 signal is driven to logic1. If the DRAM memory element 100 is storing a logic0 charge is transferred from the Bit Line 106 to the capacitor 104 which reduces the voltage on the Bit Line 106. The Bit Line 106 voltage is then sensed by a sense amplifier circuit. If the DRAM memory element 100 is storing a logic1, charge is transferred from the capacitor 104 to the Bit Line 106 which increases the voltage on the Bit Line 106. The Bit Line 106 voltage is then sensed by a sense amplifier circuit. Reading the DRAM memory element 100 modifies the charge stored on the capacitor 104 and thus necessitates that the DRAM memory element 100 be rewritten after each read FIG. 2 depicts a prior art static random access memory (SRAM) memory element 200. The SRAM memory element 200 includes a first inverter formed by p-channel MOSFET 202 and n-channel MOSFET 204, a second inverter formed by p-channel MOSFET 206 and n-channel MOSFET 208, a first n-channel MOSFET 210, and a second n-channel MOSFET 212. The first inverter and second inverter are connected in a latch configuration where the output of the first inverter is connected to the input of the second inverter and the output of the second inverter is connected to the input of the first inverter. The first n-channel MOSFET 210 is in electrical communication with the output of the first inverter, a Word Line 218 input signal, and a bidirectional Bit Line Bar 216 signal. The second n-channel MOSFET 212 is in electrical communication with the output of the second inverter, a Word Line 218 input signal and a bidirectional Bit Line 214 signal.

To store a logic0 in the SRAM memory element 200, the Bit Line 214 signal is driven to logic0 and the Bit Line Bar 216 signal is driven to logic1 while the Word Line 218 signal is driven to logic1, which forces the latch circuit to the logic0 state. To store a logic1 in the SRAM memory element 200, the Bit Line 214 signal is driven to logic1 and the Bit Line Bar 216 signal is driven to logic0 while the Word Line 218 signal is driven to logic1, which forces the latch circuit to the logic1 state.

To read the state of the SRAM memory element 200, Bit Line 214 and Bit Line Bar 216 are pre-charged to logic1 and then the Word Line 218 signal is driven to logic1. If the SRAM memory element 200 is storing a logic0, Bit Line 214 is slowly discharged, while Bit Line Bar 216 remains at logic1. The differential voltage on Bit Line 214 and Bit Line Bar 216 is then sensed by a sense amplifier circuit. If the SRAM memory element 200 is storing a logic1, Bit Line 214 remains at logic1 while Bit Line Bar 216 is slowly discharged. The differential voltage on Bit Line 214 and Bit Line Bar 216 is then sensed by a sense amplifier circuit. Reading the SRAM memory element 200 does not affect the logic state and therefore does not require data to be rewritten after each read.

The SRAM memory element 200 has several advantages over the DRAM memory element 100 when operating in radiation environments. Writing to the SRAM memory element 200 does not require elevated voltage levels and thus the overall design is less susceptible to SEGR and SEL radiation effects. Additionally, the SRAM memory element 200 actively stores the logic state, which increases the operating temperature range, reduces TID radiation sensitivity, and removes the need to periodically refresh the memory element.

FIG. 3 depicts a prior art synchronous dynamic random access memory (SDRAM) chip architecture 300. The SDRAM chip architecture 300 includes the Array 302, the Periphery 304, a Clock 306 input signal, Control 308 input signals, Address 310 input signals, and bidirectional Data 312 signals.

Array 302 represents all of the memory elements included in the chip, in embodiments the SRAM memory elements 200. Array 302 is partitioned into a number of logical banks, which are further partitioned into logical rows (pages) and logical columns. The organization of logical banks, logical rows (pages) and logical columns is defined by JEDEC specifications for each generation of SDRAM device (e.g. SDR, DDR, DDR2, etc.). Periphery 304 represents the logic used to decode SDRAM commands sent to the device, and to read from or write to Array 302. Key logic functions and circuits included in Periphery 304 are mode registers, address decoders, sense amplifiers, write drivers and page registers.

The Clock 306 input signal is used to synchronize the SDRAM chip to the memory controller or processor. The Control 308 input signals include Clock Enable (CKE), Chip Select (/CS), Write Enable (/WE), Row Address Strobe (/RAS), Column Address Strobe (/CAS) and Data Mask (DQM or DM), and are used to dictate behavior of the SDRAM chip. The Clock Enable (CKE) input signal is used to inhibit SDRAM commands. The Chip Select (/CS), Write Enable (/WE), Row Address Strobe (/RAS) and Column Address Strobe (/CAS) input signals are used to decode SDRAM commands. The Data Mask input signal is used to inhibit reads or writes (DQM) or to inhibit writes (DM) based on the SDRAM generation. The Address 310 input signals include the Row/Column Address (A) and the Bank Address (BA). The Bank Address (BA) input signals select the logical bank for the ACTIVATE, READ, WRITE and PRECHARGE commands. The Row/Column Address (A) input signals select the logical row (page) for the ACTIVATE command, and select the logical column for the READ and WRITE commands. The bidirectional Data 312 signals provide data inputs for the WRITE command and data outputs for the READ command.

Four primary SDRAM commands are used to read from or write to an SDRAM chip based on row (page) operations. The command sequence used to write to an SDRAM chip is as follows: an ACTIVATE command, followed by one or more WRITE commands, followed by a PRECHARGE command. The command sequence used to read from an SDRAM chip is as follows: an ACTIVATE command, followed by one or more READ commands, followed by a PRECHARGE command. The ACTIVATE command is used to open a logical row (page) in a logical bank based on the Row/Column Address (A) input signals and the Bank Address (BA) input signals. Only one logical row (page) may be open in a given logical bank at a time. Each logical bank may have one logical row (page) open simultaneously. The READ and WRITE commands are used to read from or write to a logical column in a logical bank based on the Row/Column Address (A) input signals and the Bank Address (BA) input signals. A READ or WRITE command may only be issued to an open logical row (page). Multiple READ or WRITE commands may be issued to an open logical row (page). The PRECHARGE command is used to close a logical row (page) in a logical bank based on the Bank Address (BA) input signals. A PRECHARGE command must be issued prior to activating a new logical row (page) via the ACTIVATE command. Although not discussed, a logical row (page) may also be closed using the AUTO PRECHARGE function.

FIG. 4 depicts a prior art single data rate (SDR) SDRAM bank architecture 400 employed for Array 302 described in FIG. 3. Array 302 is partitioned into four equal size logical banks 402. The organization of logical banks 402 is defined by JEDEC specifications for each generation of SDRAM device (e.g. SDR, DDR, DDR2, etc.). Each logical bank 402 is further partitioned into rows (pages) and columns as described in FIG. 5A and FIG. 5B for a 64 Mb SDR SDRAM chip.

FIG. 5A depicts a prior art 64 Mb SDR SDRAM row architecture 500A employed for logical bank 402 described in FIG. 4. Each logical bank 402 is partitioned into 4096 (4k) logical rows (pages) 502. The organization of logical rows (pages) 502 is defined by JEDEC specifications for each generation of SDRAM device (e.g. SDR, DDR, DDR2, etc.).

FIG. 5B depicts a prior art 64 Mb SDR SDRAM column architecture 500B for the logical bank 402 described in FIG. 4. Each logical bank 402 is partitioned into 4096 (4k) physical columns 504. The number of physical columns 504 in a given logical bank 402 is equal to the number of logical columns multiplied by the number of Data 312 signals. For example, a 64 Mb SDR SDRAM chip that uses four Data 312 signals contains 1024 (1k) logical columns whereas a 64 Mb SDR SDRAM chip that uses eight Data 312 signals contains 512 logical columns. The organization of logical columns is defined by JEDEC specifications for each generation of SDRAM device (e.g. SDR, DDR, DDR2, etc.).

FIG. 6 depicts a prior art Triple Modular Redundant (TMR) D flip-flop (DFF) circuit 600. The circuit improves single-event upset (SEU) radiation hardness by triplicating a DFF circuit 602, thus implementing redundant data storage. The triplicated DFF circuit 602 is configured such that the data input 612 and clock 614 signals are common to all DFF circuits 602 whereas the data outputs are unique. The output of each DFF circuit 602 is connected to a majority voter circuit formed by logical NAND2 gate 604, logical NAND2 gate 606, logical NAND2 gate 608 and logical NAND3 gate 610. The majority voter implements a logical AND-OR function where; logical NAND2 gate 604 forces the output to logic1 when the first and second DFF circuits 602 are storing a logic1, logical NAND2 gate 606 forces the output to logic1 when the first and third DFF circuits 602 are storing a logic1 and logical NAND2 gate 608 forces the output to logic1 when the second and third DFF circuits 602 are storing a logic1. Therefore, the TMR DFF circuit output 616 is logic0 when two or more of the DFF circuits 602 are storing logic0 and logic1 when two or more of the DFF circuits 602 are storing logic1, thus maintaining the correct output state even if one of the DFF circuits 602 experiences a single-event upset (SEU). In embodiments, SEU radiation hardening may be accomplished using a TMR DFF circuit or by using other well-known Radiation Hardened By Design (RHBD) circuits such as the dual interlocked storage cell (DICE) DFF.

FIG. 7 depicts a prior art D flip-flop (DFF) circuit 700 with a single-event transient (SET) filter on the data input signal. The circuit improves single-event transient (SET) radiation hardness by temporally filtering radiation-induced transient pulses from the data input signal. The DFF circuit 702 is configured such that the clock 710 signal and data output 712 are connected in typical fashion, whereas the data input is connected to a temporal filter circuit formed by delay elements 706 and majority voter 704. The primary data input 708 is connected directly to the majority voter 704, connected to a single delay element 706 which is further connected to the majority voter 704, and connected to a series pair of delay elements 706 which are further connected to the majority voter 704. The temporal filter circuit prevents propagation of any signal with a pulse width less than the unit delay of the delay element 706 at the cost of increasing the setup time required to store data in the DFF circuit 702. Therefore, it is important to optimize the unit delay of the delay element 706 to enhance radiation tolerance while minimizing performance degradation. In this example, temporal filtering is shown for the data input 708, but may also be applied to other critical signals such as the clock 710 or data output 712. In embodiments, SET radiation hardening is accomplished using a DFF circuit with temporal filtering or by using other RHBD techniques such as high drive logic gates that are inherently immune to SET radiation effects.

FIG. 8 depicts a block diagram 800 for a prior art single chip 512 Mb DDR3L memory. Memory sub-components comprise On-Die Termination Control (ODT Control) 805 receiving ODT input; and impedance calibration logic (ZQ CAL) 810; receiving ZQ and Control Logic 815 input, outputting to on-die termination and output driver circuits. Control Logic 815 comprises Command Decode 820 and Mode Registers 825. Address Registers 830 provide input to Bank Control Logic 835, Mode Registers 825, Column Address Latch and Counter 840, and Row Address Latch & Decoder Banks 0-7 845. Inputs to Address Registers 830 are A[12:0] and BA[2:0]. Row Address Latch & Decoder Banks 0-7 845 address Memory Array (8,192×128×64) Banks 0-7 850. Each Memory Array Bank 850 comprises a page Register and SEC/DED Error Correction Code (ECC) Logic. Note that SEC/DED ECC Logic may not be included in all embodiments. For example, ECC may not be found on a COTS part. Bank Control Logic 835 controls Row Address Latch & Decoder Banks 0-7 845 and Column (128×64) Decoder 860. Column Decoder 860 interfaces with I/O Gating Data Mask (DM) Logic 855 which interfaces (8,192 bits) with Memory Array Banks 0-7 850. Control Logic 815 provides Burst-Chop (BC4) and On-The-Fly (OTF) input to I/O Gating Data Mask (DM) Logic 855. I/O Gating Data Mask Logic 855 interfaces with Data InterFace (I/F) 865 for writing, and Read FIFO & Data MUX 870 for reading. Write Drivers & Logic 875 provide input to Data InterFace (I/F) 865. Read FIFO & Data MUX 870 provides input to Read Drivers 880 which receive input from Delay Locked Loop (DLL) 885. Joint Test Action Group and Memory Built-In Self-Test (JTAG/MBIST) 890 has inputs TCLK, TMS, TRST_L, TDI, output TDO, and MBIST engines output to support manufacturing test. These functions implement a memory compatible with the JEDEC DDR3L specification. Implementation will be further discussed with the following figures.

What is needed, therefore, are techniques for radiation hardening of SDRAM items to mitigate all pertinent radiation effects.

SUMMARY

An embodiment provides a radiation hardened synchronous Dynamic Random Access Memory (DRAM) device comprising a plurality of Static Random Access Memory (SRAM) cells forming a SRAM array; a plurality of bit registers configured with each of the plurality of SRAM cells in the SRAM array; a first column multiplexer configured to select which of the bit registers in the SRAM array is accessed; Error Detection And Correction (EDAC) logic implemented in each memory bank of the DRAM, wherein the EDAC is configured to perform an Error Correction Code (ECC) check during a READ burst and generate an ECC result during a WRITE burst for SRAM writeback during a PRECHARGE command; and a second column multiplexer wherein an accessed byte within the WRITE burst or a READ burst is selected from the selected bit registers of the first column multiplexer. In embodiments the EDAC logic comprises Single Error Correct/Double Error Detect (SEC/DED) logic implemented on-chip in each memory bank. In other embodiments, each the memory bank incorporates a bit register and Single Error Correct/Double Error Detect (SEC/DED) logic. In subsequent embodiments emulation logic is constructed using a combination of commercial logic cells and radiation hardened sequential logic elements. For additional embodiments the SRAM cells are partitioned into logical banks, each further partitioned into subarrays, thereby reducing active power consumption. In another embodiment, each bit of the bit registers comes from a unique SRAM instance, whereby multiple bit errors are reduced. Following embodiments comprise a Joint Test Action Group/Memory Built-In Self Test comprising inputs of TCLK, TMS, TRST_L, TDI, and TDO output, and MBIST engines output. In subsequent embodiments the second column multiplexer comprises a Read Modify Write (RMW) multiplexer receiving an input from a DATA multiplexer and First In First Out (FIFO) buffer and an input from a Data Mask (DM) multiplexer and FIFO. In additional embodiments bits are 'twisted' 90 degrees between the SRAM array and a page register array. In included embodiments the device complies with a JEDEC JESD79-4B standard defining a DDR3L SDRAM specification.

Another embodiment provides a method for radiation hardening synchronous Dynamic Random Access Memory (DRAM) memory banks wherein Error Detection And Correction (EDAC) is implemented on each of the memory banks on a single chip, the method comprising providing a plurality of interleaved Static Random Access Memory (SRAM) cells, wherein all logical columns for a single data bit are physically adjacent, abutting along a row, whereby the chip is less susceptible to multiple bit upsets (MBU) caused by a single charged particle due to maximum physical separation between bits in a same data word, wherein memory cells within a same data word are separated by a number of physical cells equal to a number of logical columns; providing a plurality of instances of bit registers configured to interface with the plurality of interleaved SRAM cells; providing a first column multiplexer configured to select which of the bit registers is accessed; providing Error Detection and Correction (EDAC) logic, configured to check Error Correction Code (ECC) during a READ burst and generate ECC during a WRITE burst for SRAM writeback during a PRECHARGE command; and providing a second column multiplexer wherein an accessed byte within the WRITE burst or the READ burst is selected from the selected bit registers of the first column multiplexer. In yet further embodiments each bit of the bit registers comes from a unique SRAM instance whereby multiple bit errors are reduced. In related embodiments write steps comprise inputting data to the second column multiplexer; providing an output of the second column multiplexer which is then provided to a first Pipeline Register; and providing the output of the first Pipeline Register to ECC Generation Logic. For further embodiments write steps comprise providing an output of ECC Generation Logic to a second Pipeline Register; and providing the output of the second Pipeline Register to the first column multiplexer. In ensuing embodiments write steps comprise providing an output of the first column multiplexer to the plurality of bit registers; and providing the output of the bit registers to the SRAM Array. For yet further embodiments, read steps comprise outputting data from the SRAM array to the bit registers; and outputting the bit registers to the first column multiplexer. For more embodiments, read steps comprise providing an output of the first column multiplexer to a second Pipeline Register; and providing an output of the second Pipeline Register to the EDAC logic. Continued embodiments include read steps comprising providing an output of the EDAC logic to a first Pipeline Register; and providing an output of the first Pipeline Register to the second column multiplexer. For additional embodiments, read steps comprise providing read data from an output of a first pipeline register to the second column multiplexer and outputting data from the second column multiplexer.

A yet further embodiment provides a system for radiation hardening synchronous Dynamic Random Access Memory (DRAM) memory cell banks wherein Error Detection And Correction (EDAC) is implemented on-chip in each bank, the system comprising synchronous DRAM data writing comprising inputting data to a second column multiplexer; providing output of the second column multiplexer to a first Pipeline Register; providing output of the first Pipeline Register to Error Correction Code (ECC) Generation Logic; providing output of the ECC Generation Logic to a second Pipeline Register; providing output of the second Pipeline Register to a first column multiplexer; providing output of the first column multiplexer to a plurality of bit registers; providing output of the bit registers to a SRAM Array; and ending write data flow at the SRAM Array; and synchronous DRAM data reading comprising outputting data from the SRAM Array to the plurality of the bit registers; outputting from the plurality of bit registers to the first column multiplexer; outputting from the first column multiplexer to the second Pipeline Register; providing output from the second Pipeline Register to EDAC Logic; providing EDAC Logic output to the first Pipeline Register; providing the first Pipeline Register output to the second column multiplexer; and outputting data from the second column multiplexer.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
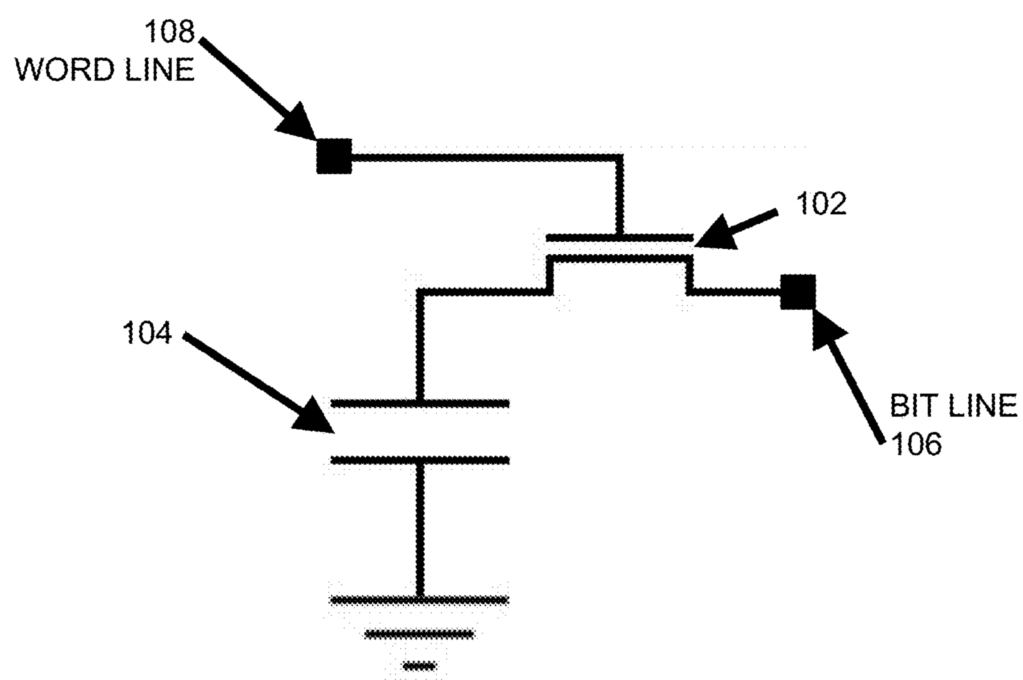
FIG. 1 depicts a prior art dynamic random access memory (DRAM) memory element.
Figure 2:
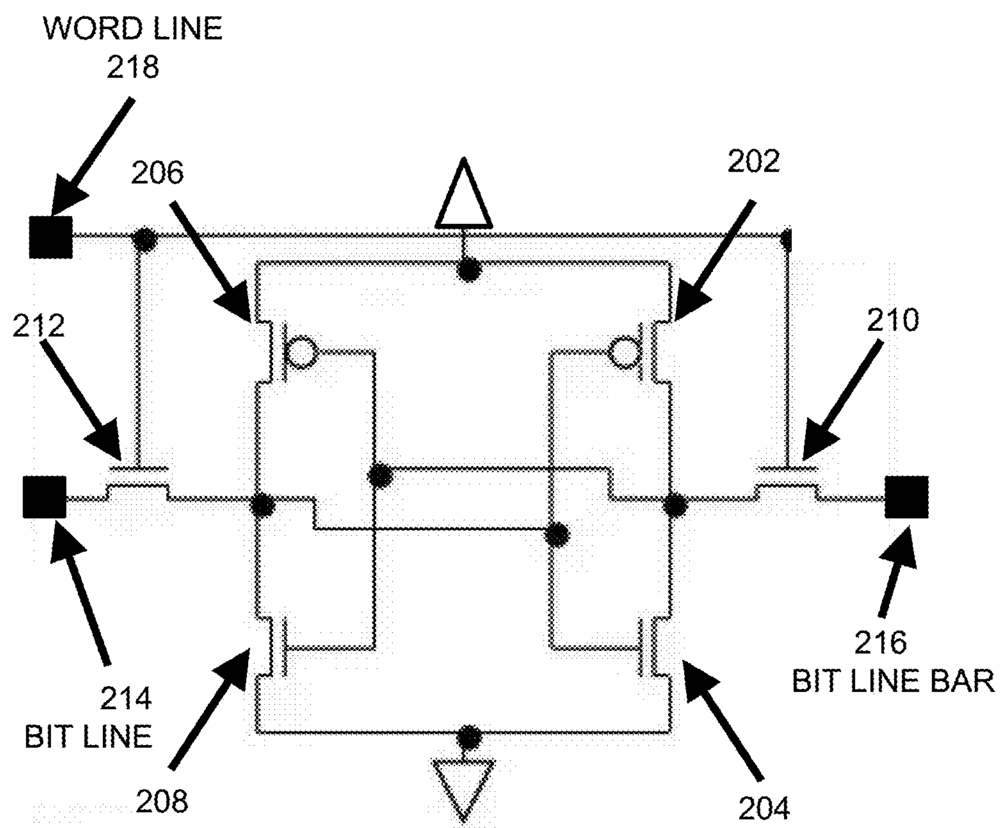
FIG. 2 depicts a prior art static random access memory (SRAM) memory element.
Figure 3:
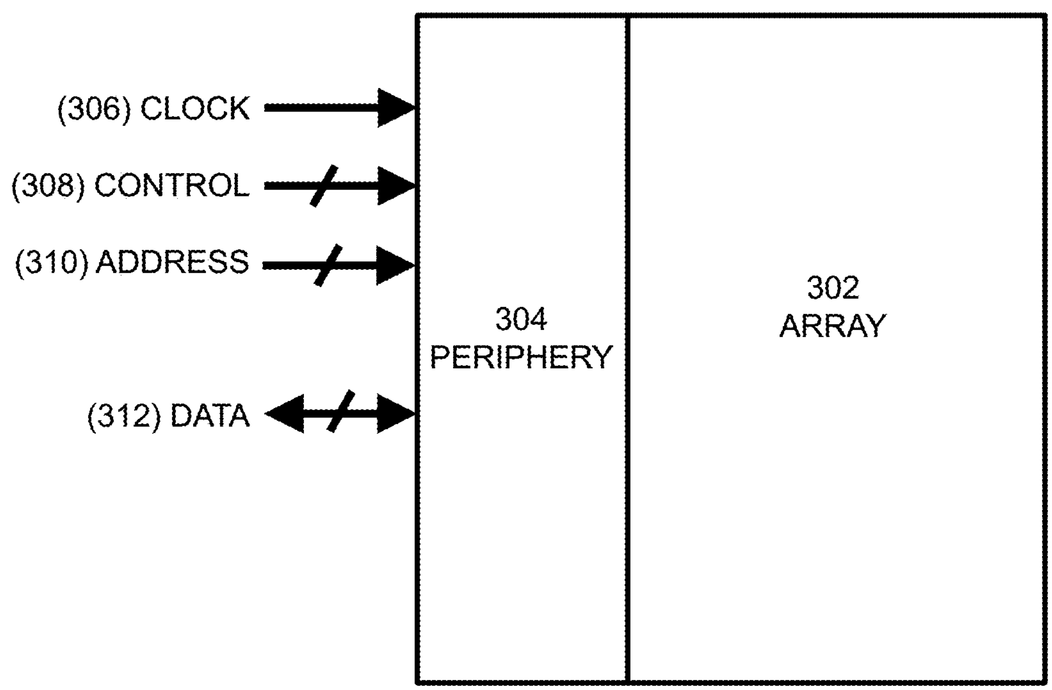
FIG. 3 depicts a prior art synchronous dynamic random access memory (SDRAM) chip architecture.

Embodiments use a combination of Radiation Hardened By Design (RHBD) techniques to radiation harden a Synchronous Dynamic Random-Access Memory (SDRAM) memory while maintaining compatibility with commercial (JEDEC) standards. Embodiments use Static Random Access Memory (SRAM) storage elements instead of Dynamic Random Access Memory (DRAM) storage elements and implement end-user transparent on-chip error detection and correction logic.

Definitions

The following definitions are provided to better understand terminology as applied to embodiments of the disclosure. “Physically adjacent”: regarding memory cell structure, this means abutting along the row, i.e. logical column 0 abuts logical column 1 which abuts logical column 2 etc. “Maximum physical separation”: refers to memory cells within the same data word that are separated by a number of physical cells equal to the number of logical columns (in practice >256 cells). “Less susceptible”: regarding vulnerability, less susceptible means, for example, eliminating multiple bit upsets for strikes with incident angles less than or equal to 85 degrees (only strikes at grazing angles are capable of hitting two cells in the same data word due to physical separation).

Embodiments provide high reliability, high density, low power radiation hardened volatile memory by leveraging a Static Random Access Memory (SRAM) memory array accessible via dynamic random access memory (DRAM) controllers. The SRAM memory cell embodiment provides the greatest stability over temperature and voltage, eliminates the need to regularly expend energy refreshing the memory cell, eliminates the high temperature data retention leakage ceiling that limits the maximum operating temperature of traditional DRAMs, eliminates stuck DRAM bits, provides superior radiation upset tolerance compared to DRAM cells, and provides maximum total ionizing dose tolerance. Embodiments are implemented as a monolithic synchronous static random access memory device (synchronous RAM with a Double Data Rate 3 (DDR3L) compatible interface).

In one embodiment, the SDRAM design contains a memory storage array and logic to implement the functionality. The functionality and requirements are cited such as in SDRAM specification, including features, functionalities, AC and DC characteristics, packages, and ball/signal assignments. There are various standards that define the minimum set of requirements for compliant SDRAM devices.

Embodiments all provide a method for radiation hardening a Synchronous Dynamic Random Access Memory (SDRAM). The method mitigates radiation effects that complicate and/or prohibit use of Commercial Off the Shelf (COTS) SDRAM components in space and other radiation environments. All radiation effect mitigations are transparent to the end user, and not all radiation effect mitigations need to be applied. However, the greatest radiation tolerance is achieved by applying all mitigations. Embodiments apply to multiple generations (SDR/DDR/DDR2/DDR3/DDR3L/DDR4 etc.) of SDRAM devices since the fundamental memory subdivisions and Concept of Operations (CONOPS) remain the same. As an example of distinctions, SDRAM has a 1-word prefetch, DDR has a 2-word prefetch, DDR2 has a 4-word prefetch, and DDR3 has an 8-word prefetch. Other embodiments employ a different signaling protocol for reading and writing the memory.

Embodiments protect against Total Ionizing Dose (TID) radiation effects. In embodiments, primary mitigation is through the use of SRAM storage elements in place of DRAM storage elements. SRAM storage elements are less susceptible to TID since they do not rely on storing charge on a capacitor that may show excessive leakage after radiation exposure. As mentioned, less susceptible storage elements eliminate multiple bit upsets for strikes with incident angles less than or equal to 85 degrees. Only strikes at grazing angles are capable of hitting two cells in the same data word due to physical separation. Also, the use of SRAM removes a periodic refresh requirement, increases the operating temperature range, and removes charge pumps which reduces SEGR and SEL susceptibility.

Embodiments also protect against Single-Event Effects (SEE) and Single-Event Upsets (SEU). In embodiments, primary mitigation is through the use of Error Detection and Correction (EDAC) logic. Another key mitigation in embodiments is ensuring adequate spacing between memory storage elements in the same data word to prevent a single charged particle from generating multiple bit upsets that defeat the error correction codes. Alternatives fully radiation harden the memory array; however, this incurs significant Size, Weight, and Power and Cost (SWaP-C) penalties. For other embodiments, primary mitigation is through the use of Radiation Hardened by Design (RHBD) logic components that minimize SEU radiation effects. Alternative embodiments use RHBD techniques such as Triple Modular Redundancy (TMR) if RHBD logic components are not available.

Embodiments protect against Single-Event Effects (SEE) and Single-Event Transients (SET). Here, for embodiments, primary mitigation is through the use of RHBD logic components that minimize SET radiation effects. Alternative embodiments use RHBD techniques such as temporal delay filters if RHBD logic components are not available. Embodiments protect against Single-Event Functional Interrupt (SEFI) by SEU/SET hardening applied to the peripheral components, and using device selection and/or layout techniques to prevent parasitic silicon controlled rectifier circuits from disrupting operation by causing Single-Event Latchup (SEL).

Figure 11:
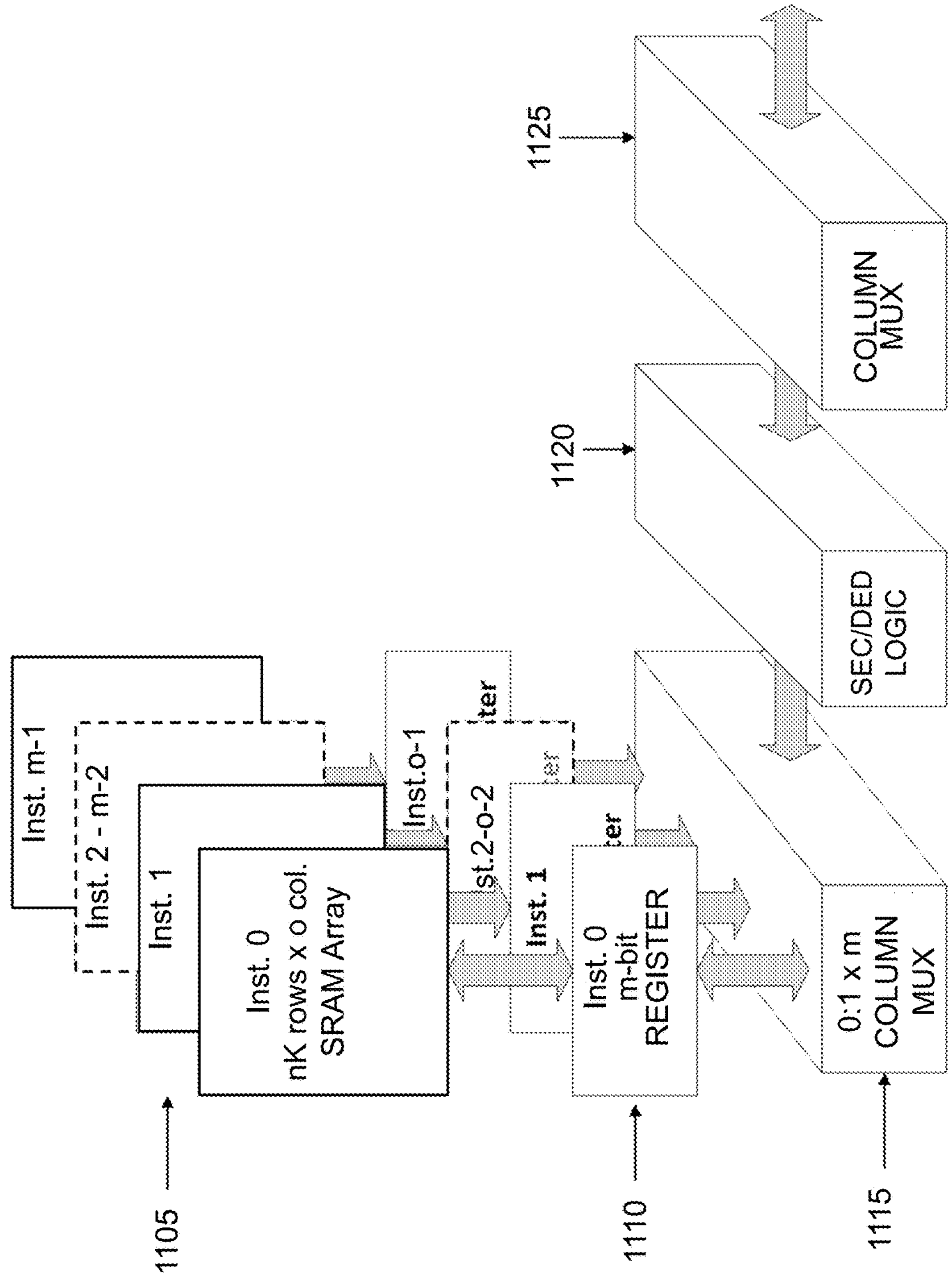
FIG. 11 is a bank architecture for a single chip memory configured in accordance with one embodiment of the present disclosure.

In exemplary embodiments, a 512 Mb monolithic DDR3L Synchronous Static Random Access Memory (SSRAM) design contains two primary components: (1) a memory storage array and (2) logic to implement the JEDEC JESD79-3-1A.01 function. JEDEC JESD79-3-1A.01 defines the DDR3L SDRAM specification, including features, functionalities, AC and DC characteristics, packages, and ball/signal assignments. This standard defines the minimum set of requirements for JEDEC compliant DDR3L SDRAM devices. It is based on the DDR3 standard (JESD79-3), and aspects of the DDR and DDR2 standards (JESD79, JESD79-2) (a block diagram of some components of a design embodiment is shown in FIG. 11). For this embodiment, the base memory array building block is constructed using a commercial SRAM memory compiler, and the DDR3L emulation logic is constructed using a combination of commercial logic cells and radiation hardened sequential logic elements. Commercial memory cells are often tuned for the semiconductor process and modifications typically impact yield and stability. A key benefit of this embodiment is that it does not require development of complex radiation hardened circuitry or modification of the foundry's preferred memory cell. The baseline design is organized as a 64M×8 array and includes additional circuitry and storage to implement Single Error Correct Double Error Detect (SECDED) Error Correction Code (ECC). To minimize active power consumption and maintain compatibility with DDR3L SDRAM specifications, the design is partitioned into eight 64 Mb banks, each organized as 8M×8. Additionally, each bank is further partitioned into sixty four 1 Mb subarrays with an additional eight 1 Mb subarrays used to store ECC (the logical organization of a single bank of the 512 Mb monolithic DDR3L SSRAM is depicted in FIG. 11). Embodiments meet design requirements mentioned above, and optimize Size, Weight, and Power and-Cost (SWAP-C).

Figure 4:
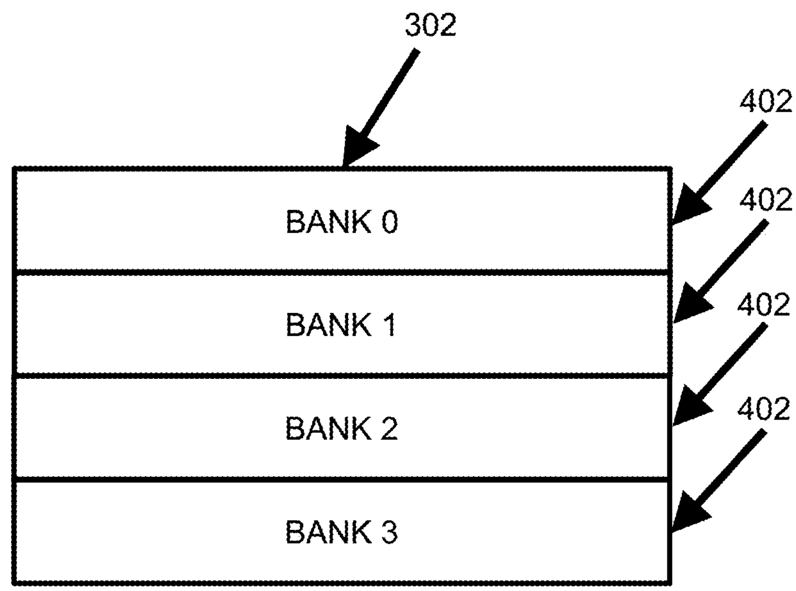
FIG. 4 depicts the prior art single data rate (SDR) SDRAM bank architecture for the array described in FIG. 3.
Figure 5A:
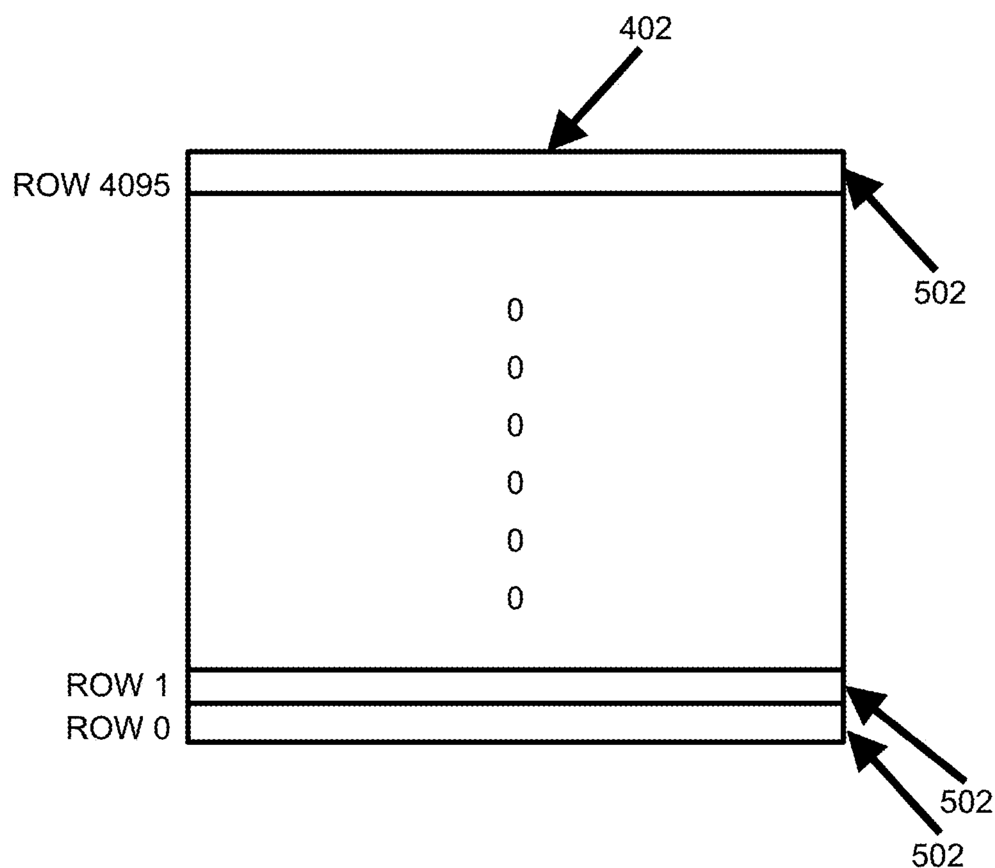
FIG. 5A depicts the prior art 64 Mb SDR SDRAM row architecture for the logical bank described in FIG. 4.
Figure 5B:
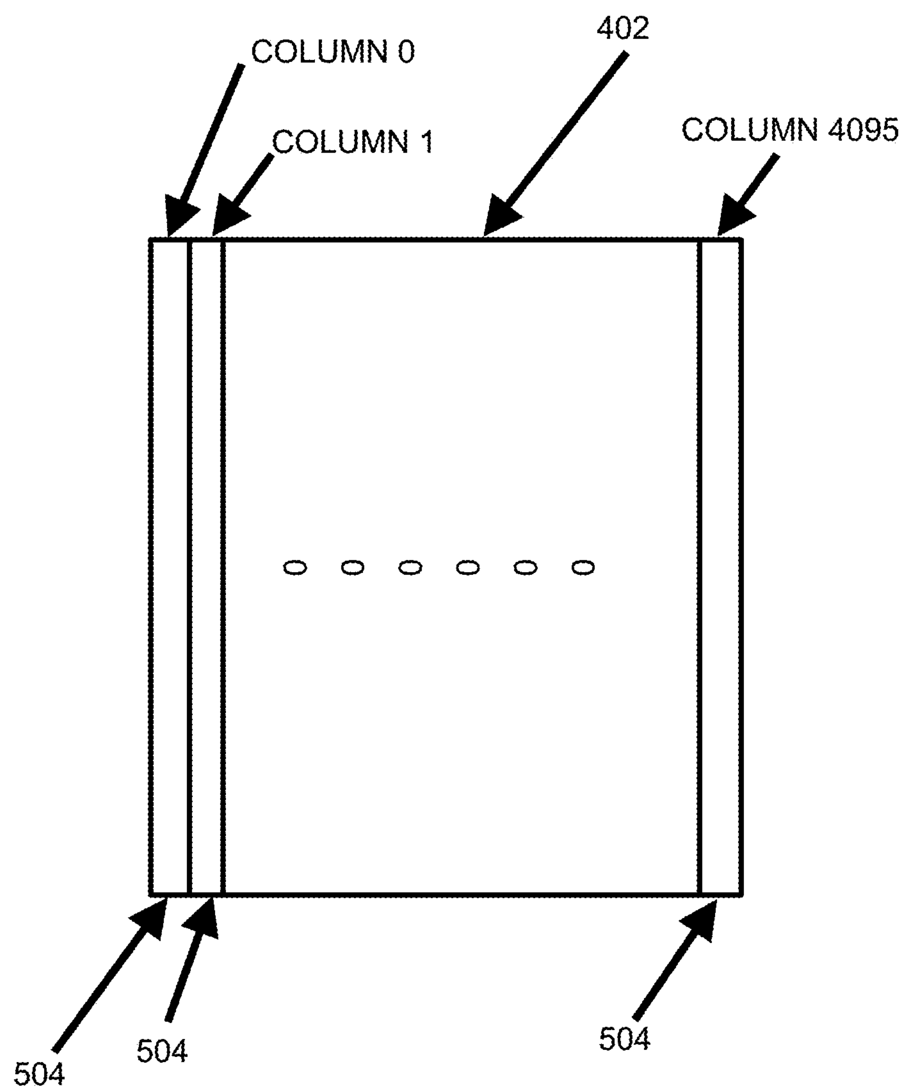
FIG. 5B depicts the prior art 64 Mb SDR SDRAM column architecture for the logical bank described in FIG. 4.
Figure 6:
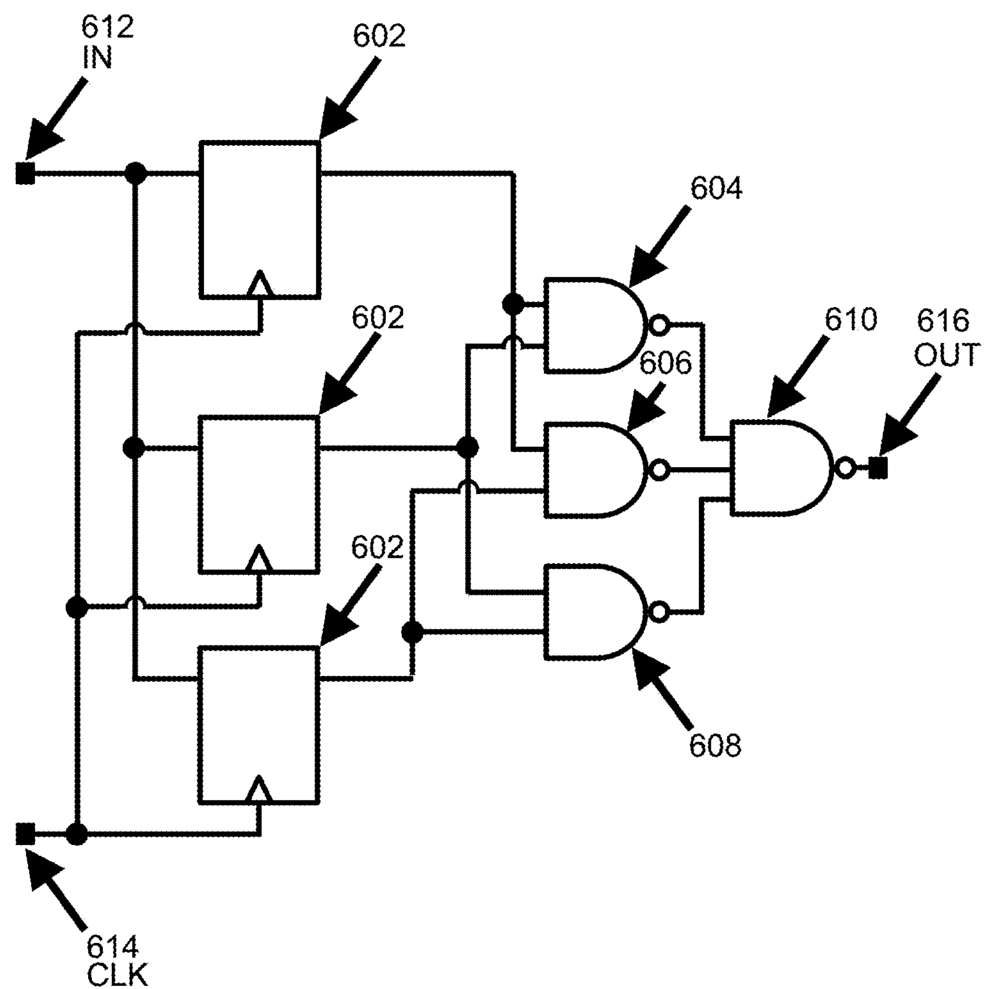
FIG. 6 depicts a prior art Triple Modular Redundant (TMR) D flip-flop (DFF) circuit.
Figure 7:
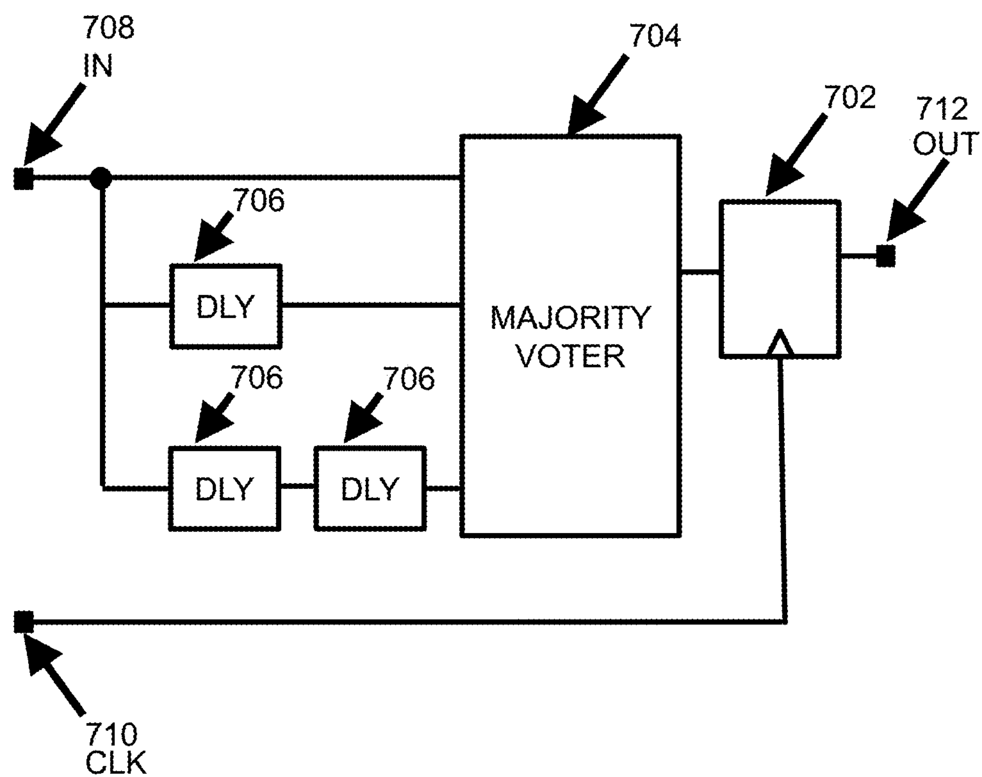
FIG. 7 depicts a prior art D flip-flop (DFF) circuit with a single-event transient (SET) filter on the data input signal.
Figure 8:
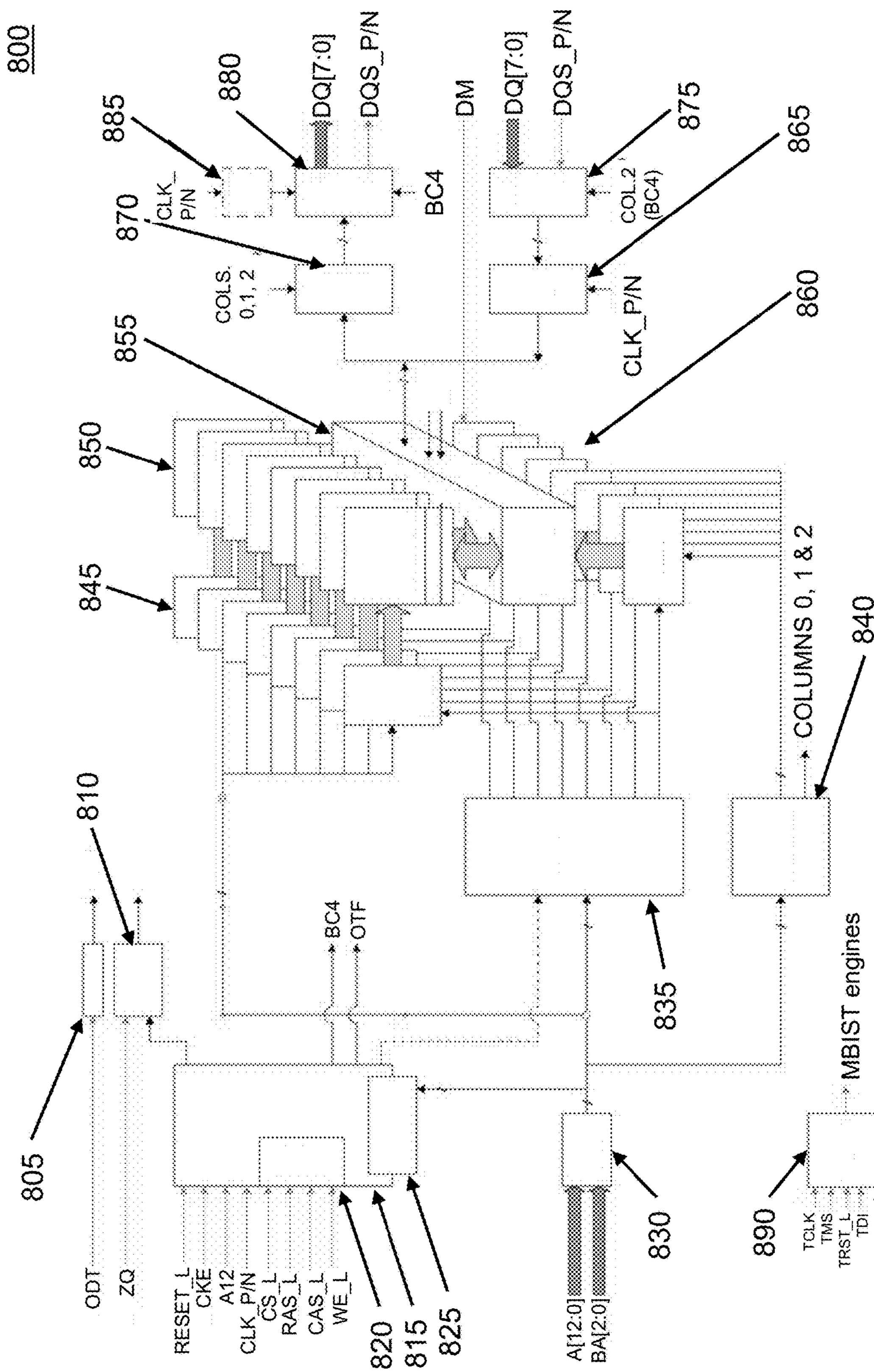
FIG. 8 is a block diagram of a prior art single chip memory sub-components 512 Mb DDR3L memory.
Figure 9A:
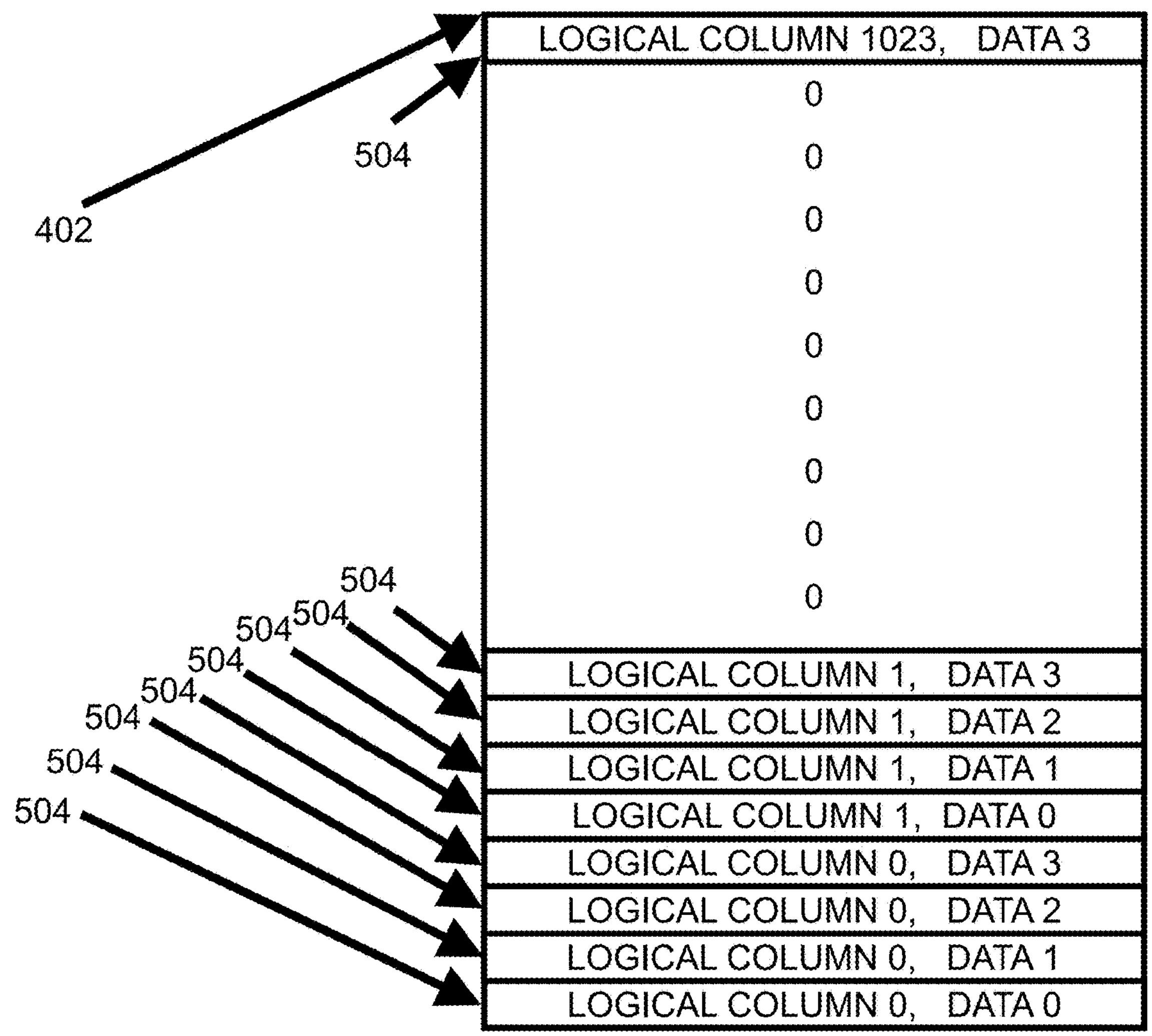
FIG. 9A depicts the prior art 64 Mb SDR SDRAM physical bit separation for the logical bank described in FIG. 4.

FIG. 9A depicts prior art 64 Mb SDR SDRAM physical bit separation 900A for the logical bank 402 described in FIG. 4. In this example, the 64 Mb SDR SDRAM uses four Data 312 signals and is thus organized as 4 Meg×4×4 banks. The physical columns 504 are organized such that each bit of a four-bit data word are physically adjacent. As mentioned, physically adjacent means abutting along the row, i.e. logical column 0 abuts logical column 1 which abuts logical column 2 etc. This physical organization of logical columns causes the 64 Mb SDR SDRAM chip to be more susceptible to multiple bit upsets (MBU) caused by a single charged particle due to physical proximity. Furthermore, this physical organization of logical columns reduces the effectiveness of error detection and correction (EDAC) logic due to increased MBU susceptibility.

Figure 9B:
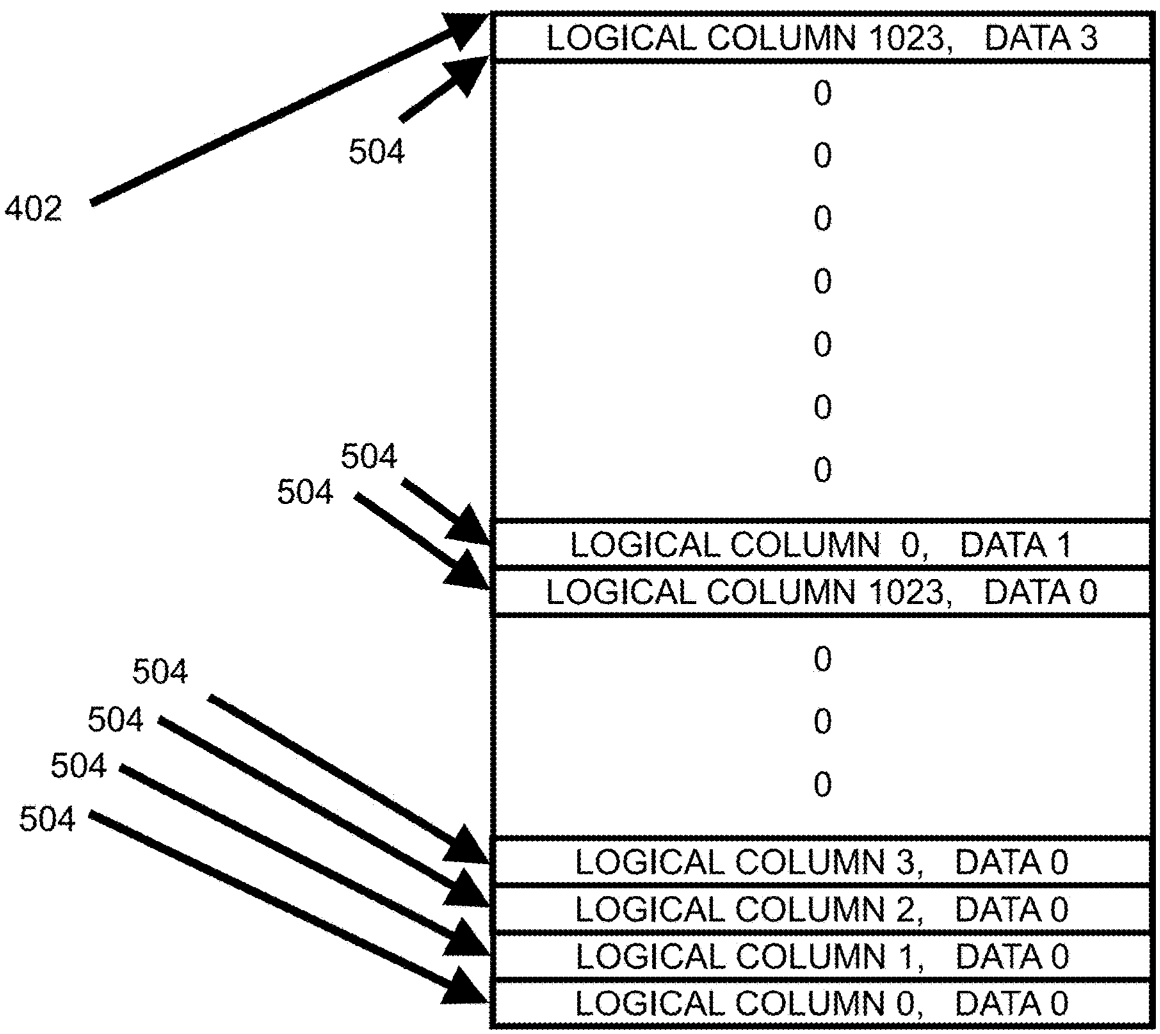
FIG. 9B depicts 64 Mb SDR SDRAM physical bit separation for the logical bank described in FIG. 4 configured in accordance with one embodiment of the present disclosure.

FIG. 9B depicts an embodiment for 64 Mb SDR SDRAM physical bit separation 900B for the logical bank 402 described in FIG. 4, in contrast to the prior art depicted in FIG. 9A. In this embodiment example, the 64 Mb SDR SDRAM uses four Data 312 signals, and is thus organized as 4 Meg×4×4 banks. In embodiments, the physical columns 504 are organized such that all logical columns for a single data bit are physically adjacent (abutting along the row, i.e. logical column 0 abuts logical column which abuts logical column 2 etc.). Importantly, this physical organization of logical columns causes the 64 Mb SDR SDRAM chip to be less susceptible to multiple bit upsets (MBU) caused by a single charged particle due to maximum physical separation between bits in a four-bit data word. As mentioned, maximum physical separation refers to memory cells within the same data word that are separated by a number of physical cells equal to the number of logical columns (in practice >256 cells). Furthermore, this physical organization of logical columns increases the effectiveness of error detection and correction (EDAC) logic due to decreased MBU susceptibility. Embodiment FIG. 9B depicts a physical reordering of the logical columns which maximizes the physical distance between bits in a single data word, thus enhancing ECC effectiveness. SDRAM physical organization of logical columns is ordered as all DQ0 columns, followed by all DQ1 columns, followed by all DQ2 columns, followed by all DQ3 columns. In prior art FIG. 9A, the bits in a single data word are physically adjacent (tightly grouped). In embodiment FIG. 9B, the bits in a single data word are separated by 1024 physical bits.

Figure 10A:
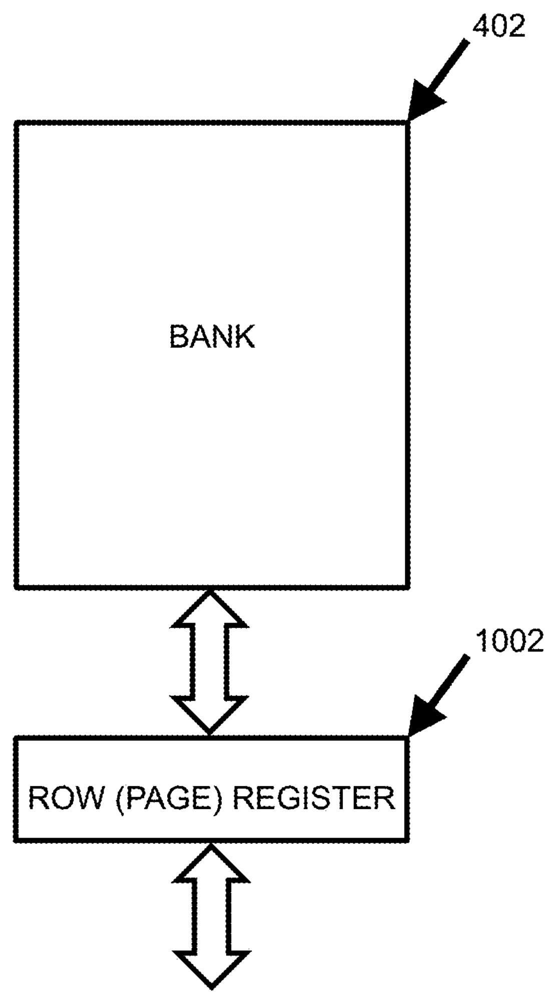
FIG. 10A depicts a prior art SDR SDRAM read/write block diagram.

FIG. 10A depicts a prior art SDR SDRAM read/write block diagram. The command sequence used to read from or write to an SDRAM chip is as follows: an ACTIVATE command, followed by one or more READ or WRITE commands, followed by a PRECHARGE command. The ACTIVATE command is used to open (read) a logical row (page) 502 in a logical bank 402 and temporarily store the values in a Row (Page) Register 1002. A READ command may be issued to read data from a logical column of the open logical row (page) 502, temporarily stored in the Row (Page) Register 1002, in a logical bank 402 based on the Row/Column Address (A) input signals and the Bank Address (BA) input signals. Similarly, a WRITE command may be issued to write data to a logical column of the open logical row (page) 502, temporarily stored in the Row (Page) Register 1002, in a logical bank 402 based on the Row/Column Address (A) input signals and the Bank Address (BA) input signals. The READ and WRITE commands perform indirect read and write operations via the Row (Page) Register 1002. The PRECHARGE command is used to close (write) a logical row (page) 502 in a logical bank 402 using the values temporarily stored in the Row (Page) Register 1002.

Figure 10B:
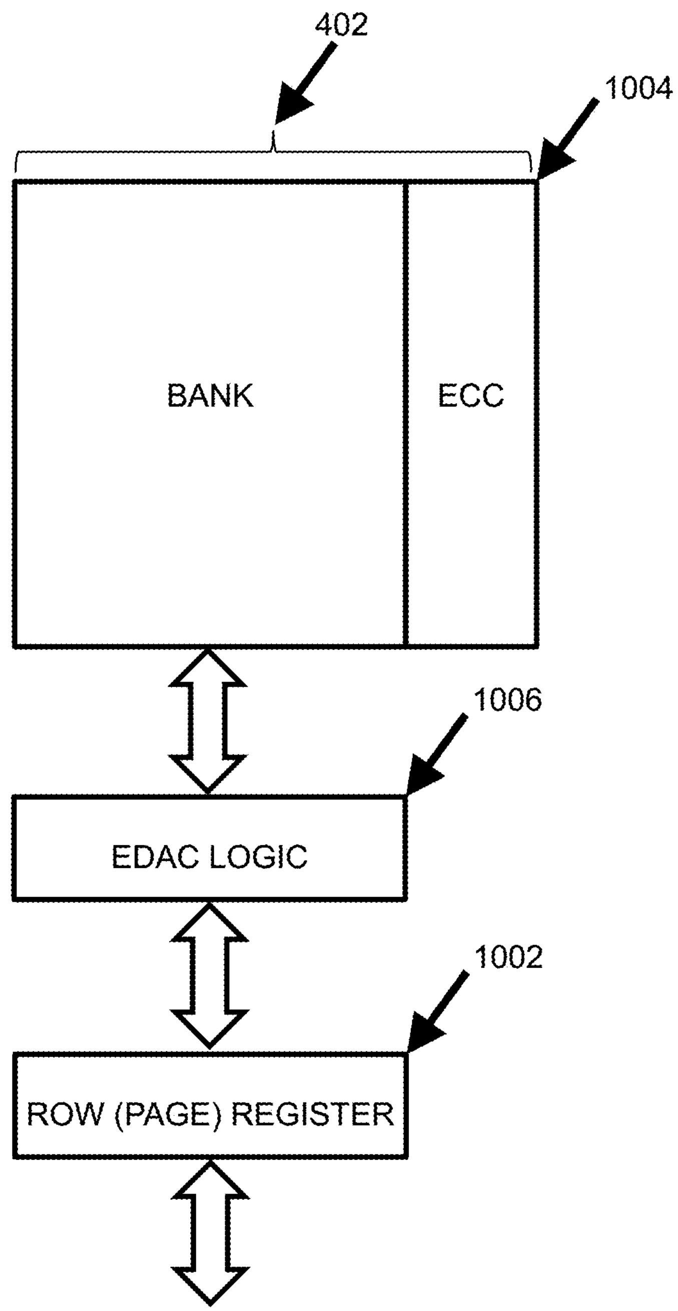
FIG. 10B depicts an SDR SDRAM read/write block diagram with on-chip error detection and correction (EDAC) logic configured in accordance with one embodiment of the present disclosure.

FIG. 10B depicts a SDR SDRAM read/write embodiment block diagram with on-chip error detection and correction (EDAC) logic in contrast to the prior art depicted in FIG. 10A. For some embodiments, additional SRAM memory elements 200 (not shown) are added to the logical bank 402 and used to store error correction codes (ECC) 1004. Other embodiments do not include this. The error correction codes (ECC) may be applied to a single data word, a group of data words (burst), or an entire logical row (page) 502 (not shown) to optimize performance versus overhead costs. For embodiments, EDAC Logic 1006 is inserted between the Row (Page) Register 1002 and the logical bank 402 to reduce single-event upset (SEU) susceptibility. The ACTIVATE command is used to open (read) a logical row (page) 502 (not shown) in a logical bank 402 and temporarily store the values in a Row (Page) Register 1002. During the ACTIVATE command, the logical row (page) 502 (not shown) data and the ECC 1004 are passed through the EDAC Logic 1006 to check for errors and apply corrections when possible before temporarily storing the data in the Row (Page) Register 1002. A READ command may be issued to read data from a logical column of the open logical row (page) 502 (not shown), temporarily stored in the Row (Page) Register 1002, in a logical bank 402 based on the Row/Column Address (A) input signals and the Bank Address (BA) input signals. Similarly, a WRITE command may be issued to write data to a logical column of the open logical row (page) 502 (not shown), temporarily stored in the Row (Page) Register 1002, in a logical bank 402 based on the Row/Column Address (A) input signals and the Bank Address (BA) input signals. The READ and WRITE commands perform indirect read and write operations via the Row (Page) Register 1002. The PRECHARGE command is used to close (write) a logical row (page) 502 (not shown) in a logical bank 402 using the values temporarily stored in the Row (Page) Register 1002. During the PRECHARGE command, the temporary data stored in the Row (Page) Register 1002 is passed through the EDAC Logic 1006 to generate new ECC 1004 before permanently storing in the logical bank 402. The implementation of the EDAC Logic 1006 and ECC 1004 does not modify the command sequence used to read from or write to the SDR SDRAM chip and is therefore transparent to the SDR SDRAM memory controller. The embodiment of FIG. 10B adds user transparent EDAC (ECC) to the memory array to improve SEU. The EDAC functions are hidden behind the existing SDRAM ACTIVATE (open row/page) and PRECHARGE (close row/page) commands as described.

FIG. 11 depicts a bank architecture 1100 for a single chip memory (512 Mb DDR3L memory in FIG. 12) which includes memory cell interleaving to reduce multiple bit upsets (MBU) caused by a single charged particle. Embodiments comprise m instances (72 instances in FIG. 12) of a nK×"o" SRAM Array 1105 (8K×128 in FIG. 12). "a" SRAM instances store data (sixty-four SRAM instances in FIG. 12), and "b" SRAM instances store Error Correction Code (ECC) (eight SRAM instances in FIG. 12) where "a"+"b"="m". Embodiments further comprise "o" m-bit registers 1110 (128 72-bit registers in FIG. 12). The m-bit registers 1110 temporarily store one page (1 KB+ECC in FIG. 12) of data from the SRAM array. Each bit of an m-bit register 1110 (72-bit register in FIG. 12) comes from a unique SRAM instance to minimize multiple bit upsets (MBU) caused by a single charged particle. Embodiments comprise an "o":1×m Column MUX 1115 (128:1×72 Column MUX in FIG. 12). The most significant bits of the column address bus (A[9:3] in FIG. 12) select which m-bit register 1110 is accessed during a READ or WRITE burst. Each m-bit register 1110 contains one burst of data (8 bytes in FIG. 12) plus ECC (1 byte in FIG. 12). MUX 1115 receives input/output from SEC/DED Logic 1120. ECC (SEC/DED) is checked during a READ burst. If a single bit error is detected, the corrected data is passed to the MUX 1125. If a multiple bit error is detected, the uncorrected data is passed to the MUX 1125 and an internal error flag is set. ECC is generated during a WRITE burst for SRAM writeback which occurs when a PRECHARGE command is issued to the bank. In embodiments, a column (8:1×8 Column in FIG. 12) MUX 1125 provides input/output to SEC/DED Logic 1120. The least significant bits of the column address bus (A[2:0] in FIG. 12) select which byte, via MUX 1125 is accessed within a burst of data.

Figure 12:
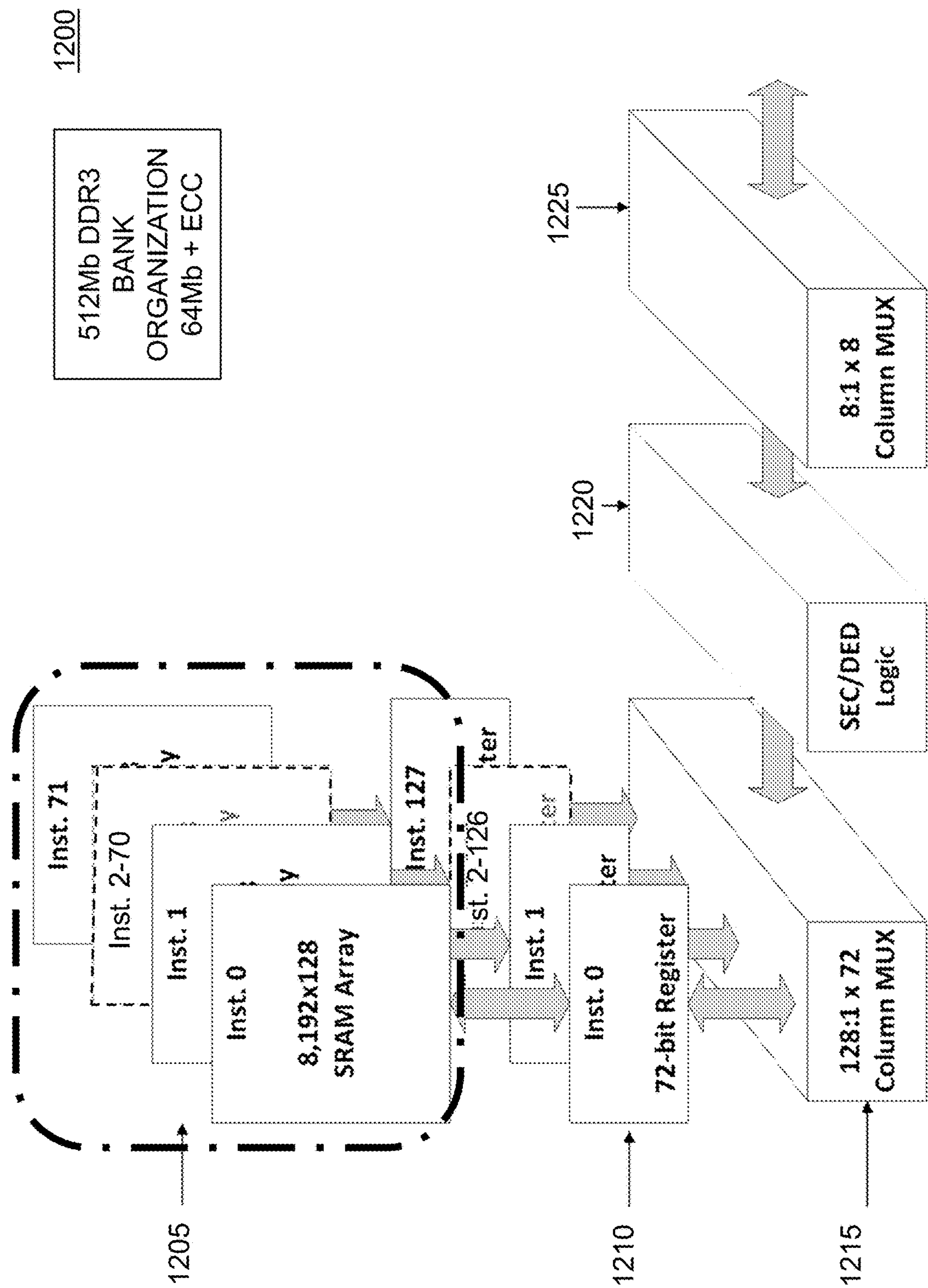
FIG. 12 is a bank architecture for a single chip 512 Mb DDR3L memory configured in accordance with one embodiment of the present disclosure.

FIG. 12 depicts a bank architecture 1200 for a single chip 512 Mb DDR3L memory example embodiment which includes memory cell interleaving to reduce multiple bit errors. Other embodiments comprise one or multiple generations of SDRAM devices (DDR/DDR2/DDR3/DDR3L/DDR4, etc.). Embodiments comprise 72 instances of an 8K×128 SRAM Array 1205. This is depicted by the dashed outline. Sixty-four SRAM instances store data, and eight SRAM instances store Error Correction Code (ECC). Embodiments further comprise 128 72-bit registers 1210. The registers temporarily store one page (1 KB+ECC) of data from the SRAM array. Each bit of a 72-bit register comes from a unique SRAM instance to minimize multiple bit upsets (MBU) caused by a single charged particle. Embodiments comprise a 128:1×72 Column MUX 1215. In embodiments, column addresses A[9:3] select which 72-bit register is accessed during a READ or WRITE burst. Each 72-bit register contains one burst of data (8 bytes) plus ECC (1 byte). MUX 1215 receives input/output from SEC/DED Logic 1220. ECC (SEC/DED) is checked during a READ burst. If a single bit error is detected, the corrected data is passed to the MUX 1225. If a multiple bit error is detected, the uncorrected data is passed to the MUX 1225 and an internal error flag is set. ECC is generated during a WRITE burst for SRAM writeback which occurs when a PRECHARGE command is issued to the bank. In embodiments, an 8:1×8 Column MUX 1225 provides input/output to SEC/DED Logic 1220. Column addresses A[2:0] select which byte, via MUX 1225, is accessed within a burst of data.

Figure 13:
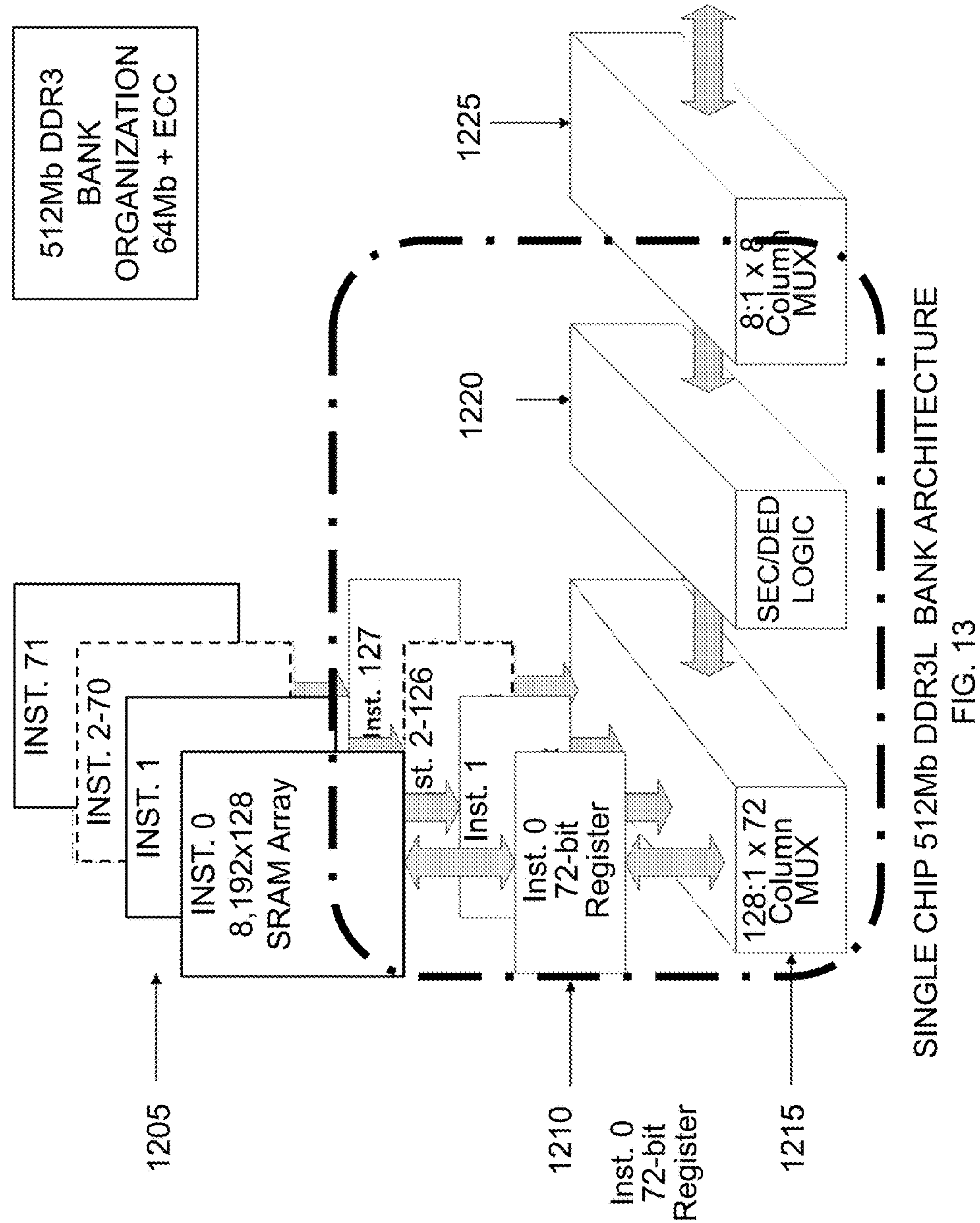
FIG. 13 is a bank architecture for a single chip 512 Mb DDR3L memory which includes on-chip EDAC logic configured in accordance with one embodiment of the present disclosure.

FIG. 13 depicts a bank architecture 1300 for a single chip 512 Mb DDR3L memory example embodiment which includes on-chip EDAC logic. Here, error detection and correction components 1210, 1215, and 1220 are depicted by the dashed outline. Otherwise, components and operation are the same as described for FIG. 12. Detailed descriptions of the EDAC logic are provided in FIGS. 14-16.

Figure 14:
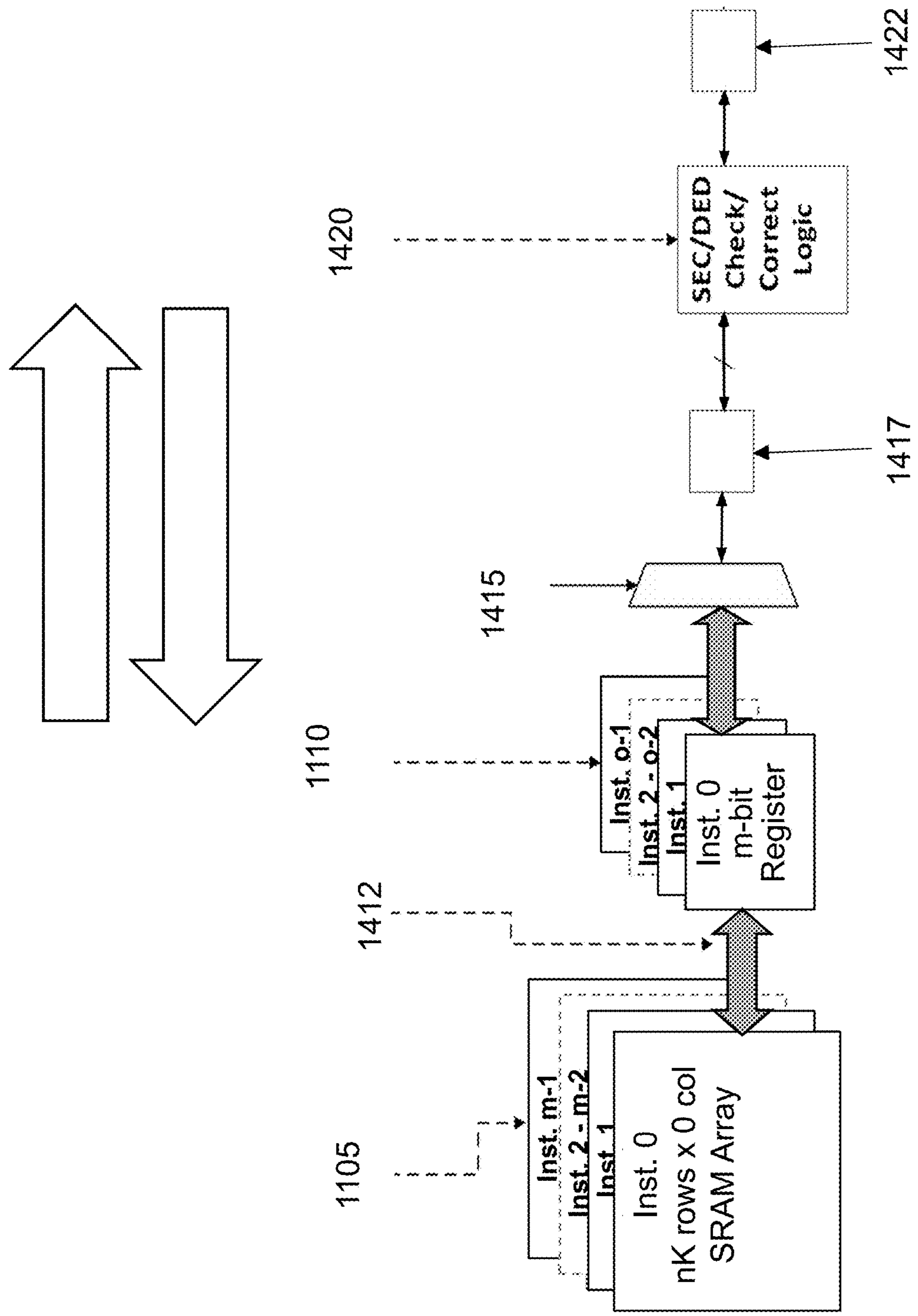
FIG. 14 is a write-read data flow for a single chip memory which includes on-chip EDAC logic configured in accordance with one embodiment of the present disclosure.

FIG. 14 depicts the detailed read/write data flow 1400 for a single chip memory (512 Mb DDR3L in FIG. 15) which includes on-chip EDAC logic. In embodiments, read data flow begins with m instances (72 instances in FIG. 15) of a nK×"o" (8K×128 in FIG. 15) SRAM Array 1105, (corresponding to 1105 of FIG. 11). As mentioned in FIG. 11, "a" (sixty-four in FIG. 15) SRAM instances store data, and "b" (eight in FIG. 15) SRAM instances store Error Correction Code (ECC) where "a"+"b"="m". Input/output from SRAM Array 1105 is input/output to "o" instances (128 instances in FIG. 15) of m-bit (72 bit in FIG. 15) registers 1110, relating to FIG. 11 m-bit registers 1110. Input/output 1412 "twists" bits 90 degrees between SRAMs and the m-bit registers 1110. Registers 1110 interface with MUX/Select 1415, (relating to FIG. 11, 1115) MUX/Select 1415 interfaces with Pipeline Register 1417 (outputs a single burst of data (8 bytes) plus ECC (1 byte) to the Pipeline Register 1517 in FIG. 15, and receives input from the Pipeline Register 1617 in FIG. 16). Input/output from Pipeline Register 1417 provides input/output to SEC/DED ECC Gen/Check/Correct Logic 1420 (related to SEC/DED Logic 1120 of FIG. 11, SEC/DED Check/Correct Logic 1520 of FIG. 15, and ECC Gen Logic 1620 of FIG. 16). SEC/DED ECC Gen/Check/Correct Logic 1420 interfaces with second Pipeline Register 1422 (outputs ECC corrected data to the second Pipeline Register 1522 in FIG. 15, and receives data from second Pipeline Register 1622 in FIG. 16). In read mode Pipeline Register 1422 provides output to DATA FIFO and MUX 1530 and read data to RMW (Read Modify Write) MUX 1535 in FIG. 15, and in write mode receives data from RMW (Read Modify Write) MUX 1625 in FIG. 16). It should be noted that Pipeline Register 1417 and Pipeline Register 1422 are included in embodiments to improve device performance, and may be omitted. It should also be noted that the ordering of the m-bit registers 1110 and SEC/DED ECC Gen/Check/Correct Logic 1420 may be swapped while maintaining equivalent functionality.

Figure 15:
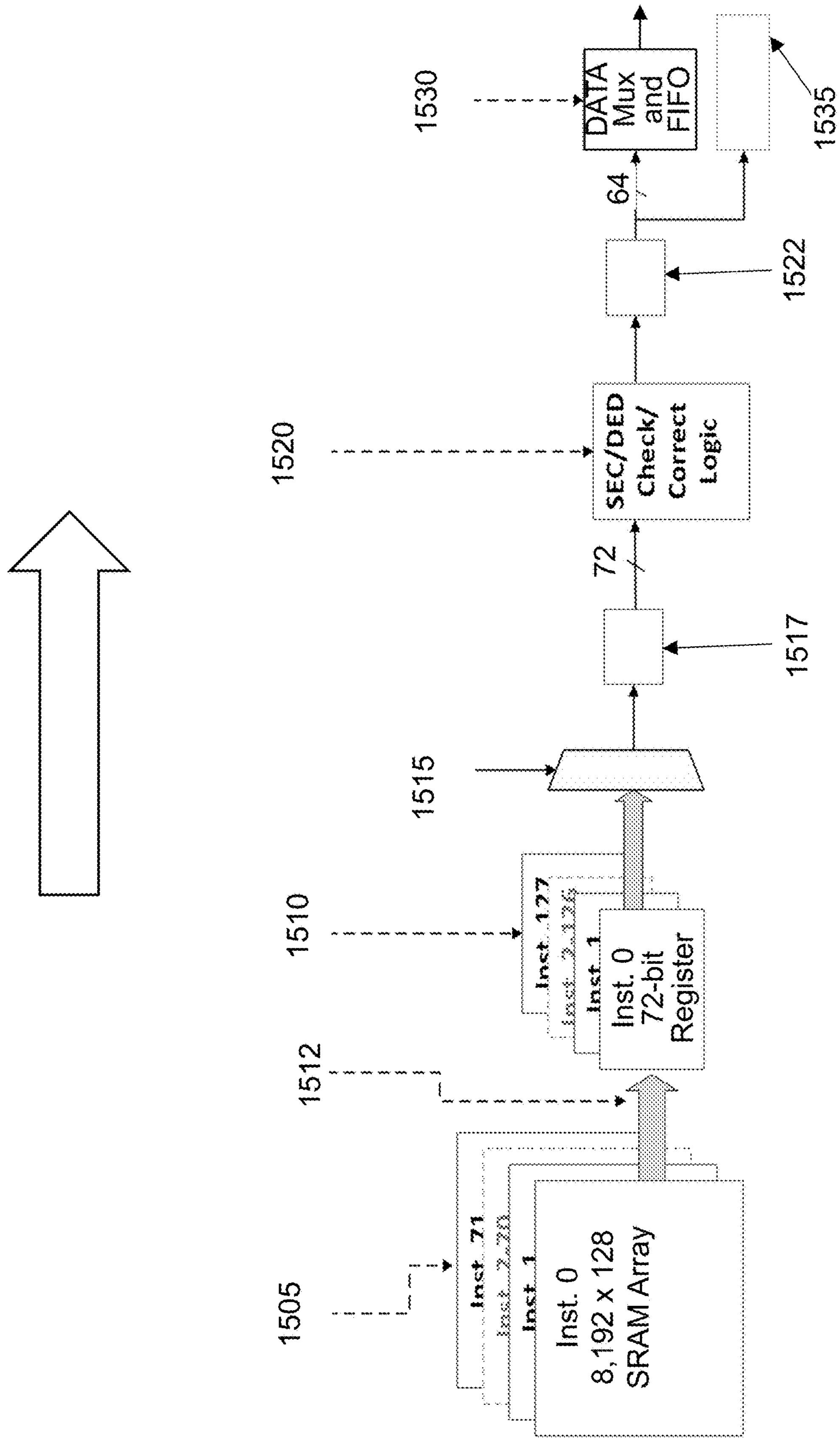
FIG. 15 is a read data flow for a single chip 512 Mb DDR3L memory which includes on-chip EDAC logic configured in accordance with one embodiment of the present disclosure.

FIG. 15 depicts the detailed read data flow 1500 for a single chip 512 Mb DDR3L memory which includes on-chip EDAC logic. In embodiment examples, read data flow begins with 72 instances of an 8K×128 SRAM Array 1505, corresponding to 1205 of FIG. 12. As mentioned in FIG. 12, sixty-four SRAM instances store data, and eight SRAM instances store Error Correction Code (ECC). Output from SRAM Array 1505 is input to 128 instances of 72-bit registers 1510, relating to FIG. 12 72-bit registers 1210. Output 1512 "twists" bits 90 degrees between SRAMs and the 72-bit registers 1510. Output from Registers 1510 is input to 128:1×72 MUX 1515, relating to FIG. 12 MUX 1215. MUX 1515 outputs a single burst of data (8 bytes) plus ECC (1 byte) to the Pipeline Register 1517. Output from Pipeline Register 1517 provides input to SEC/DED Check/Correct Logic 1520, related to SEC/DED Logic 1220 of FIG. 12. SEC/DED Check/Correct Logic 1520 outputs ECC corrected data to the second Pipeline Register 1522. Output from Pipeline Register 1522 provides input to DATA FIFO and MUX 1530 and input to Read data to RMW (Read Modify Write) MUX 1535. Note that DATA FIFO and MUX 1530 is part of MUX 1225 of FIG. 12, and RMW (Read Modify Write) MUX 1535 is part of SEC/DED Logic 1220 of FIG. 12. It should be noted that Pipeline Register 1517 and Pipeline Register 1522 are included in embodiments to improve device performance and may be omitted. It should also be noted that the ordering of the 72-bit registers 1510 and SEC/DED/Check/Correct Logic 1520 may be swapped while maintaining equivalent functionality.

Figure 16:
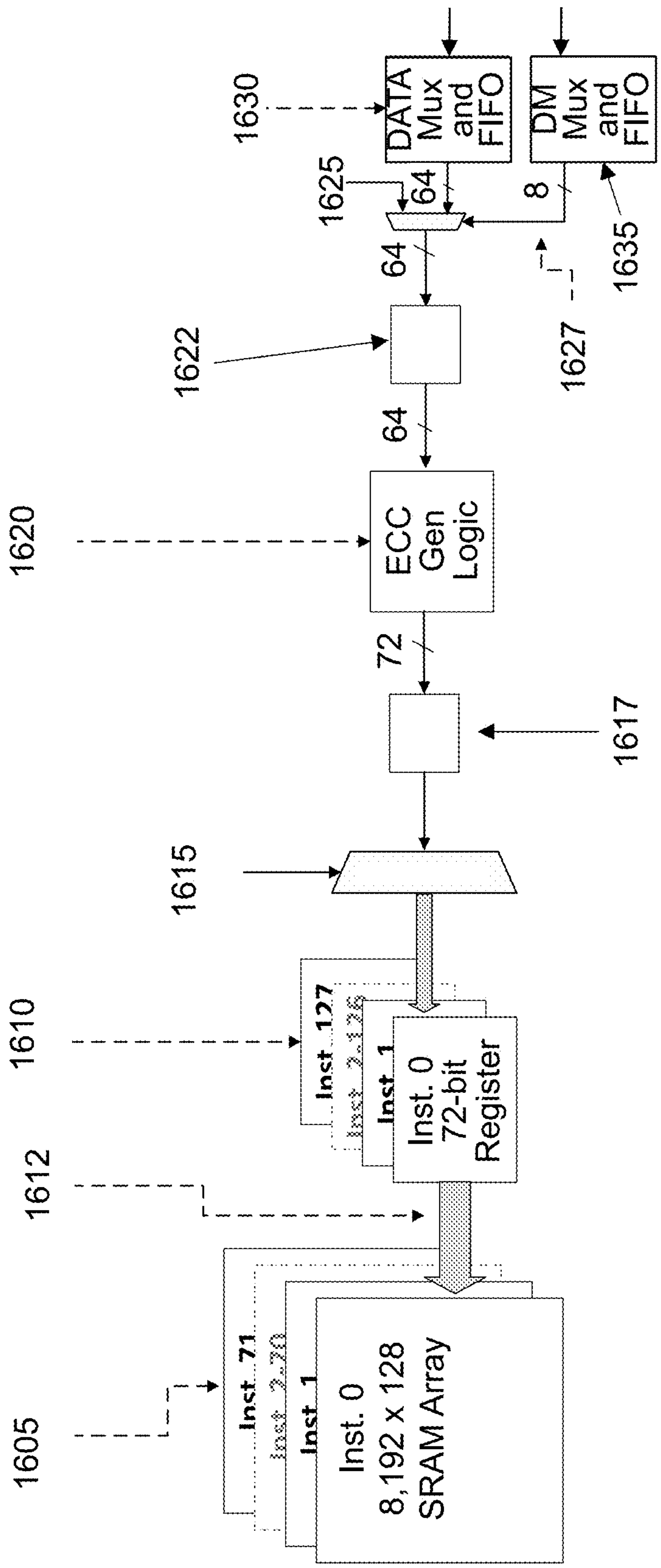
FIG. 16 is a write data flow for a single chip 512 Mb DDR3L memory which includes on-chip EDAC logic configured in accordance with one embodiment of the present disclosure.

FIG. 16 depicts the detailed write data flow 1600 for a single chip 512 Mb DDR3L memory which includes on-chip EDAC logic. Here, for writing data, input is provided to DATA MUX and FIFO 1630 and DM MUX and FIFO 1635. DATA MUX and FIFO 1630 provides a 64-bit input to RMW (Read Modify Write) MUX 1625. DM MUX and FIFO 1635 provides an 8-bit input to RMW (Read Modify Write) MUX 1625 which selects existing read data for RMW (Read Modify Write) MUX 1625, if DM=1 for the current byte. A 64-bit RMW (Read Modify Write) MUX 1625 output is input to Pipeline Register 1622. Output from Pipeline Register 1622 provides a 64-bit input to ECC Generation Logic 1620 which provides a 72-bit output, which includes a burst of data (8 bytes) plus ECC (1 byte), to Pipeline Register 1617. Output from Pipeline Register 1617 provides input to 128:1 Select MUX 1615, relating to MUX 1215 of FIG. 12. Output from 128:1 Select MUX 1615 provides input to 128 instances of 72-bit registers 1610, relating to FIG. 12 72-bit registers 1210. Note that, in embodiments, 1205, 1505, 1605, and 1210, 1510, 1610, and 1215, 1515, 1615 can correspond. 72-bit registers 1610 output 1612 "twists" bits 90 degrees between the 72-bit registers 1610 and SRAMs. Write data flow ends with 72 instances of an 8K×128 SRAM Array 1605, corresponding to SRAM Array 1205 of FIG. 12. It should be noted that Pipeline Register 1617 and Pipeline Register 1622 are included in embodiments to improve device performance, and may be omitted. It should also be noted that the ordering of the 72-bit registers 1610 and ECC GEN Logic 1620 may be swapped while maintaining equivalent functionality.

Figure 17:
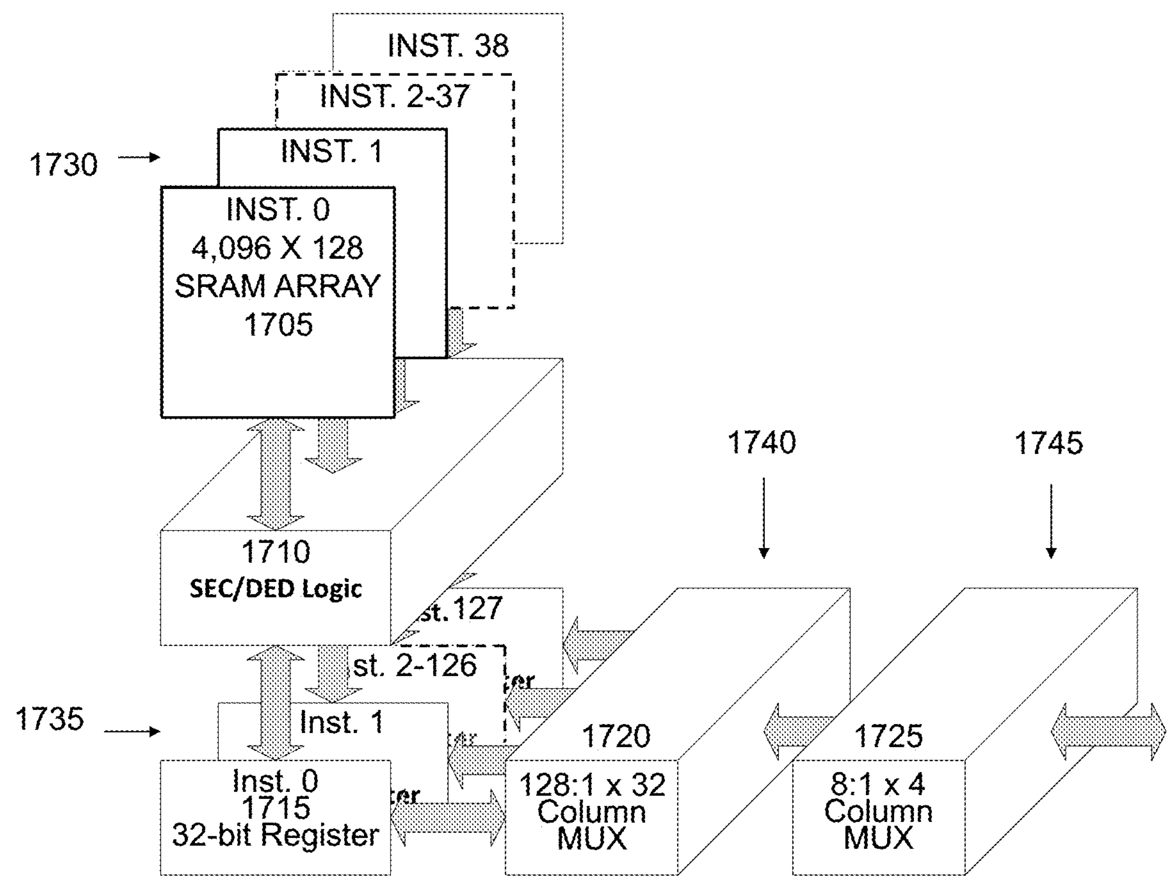
FIG. 17 depicts a 64 Mb SDR SDRAM bank architecture configured in accordance with one embodiment of the present disclosure.

FIG. 17 depicts a 64 Mb SDR SDRAM bank architecture 1700. It includes a 64 Mb SDR SDRAM Bank Organization 16 Mb+ECC. Embodiment components comprise 4,096×128 SRAM Array, instances 0 through 38 1705; SEC/DED Logic 1710; 32-bit Register, instances 0 through 127 1715; 128:1×32 Column MUX 1720; and 8:1×4 Column MUX 1725. There are 39 Instances of a 4K×128 SRAM, with 32 instances that store data and 7 instances that store error correction code; EDAC (SEC/DED) is applied when opening a row 1730 and generated when closing a row 1730. 128 32-bit registers represent 1 page (512B); each bit of a 32-bit register comes from a unique SRAM instance to minimize multiple bit upsets (MBU). If a multiple bit upset (MBU) is detected, no correction is applied as controller level EDAC may be capable of correcting some errors 1735. A[9:3] select which 32-bit register is accessed during a read or write burst; each 32-bit register contains one burst of data (8N) 1740. A[2:0] select which nibble is accessed within a burst of data 1745.

Figure 18:
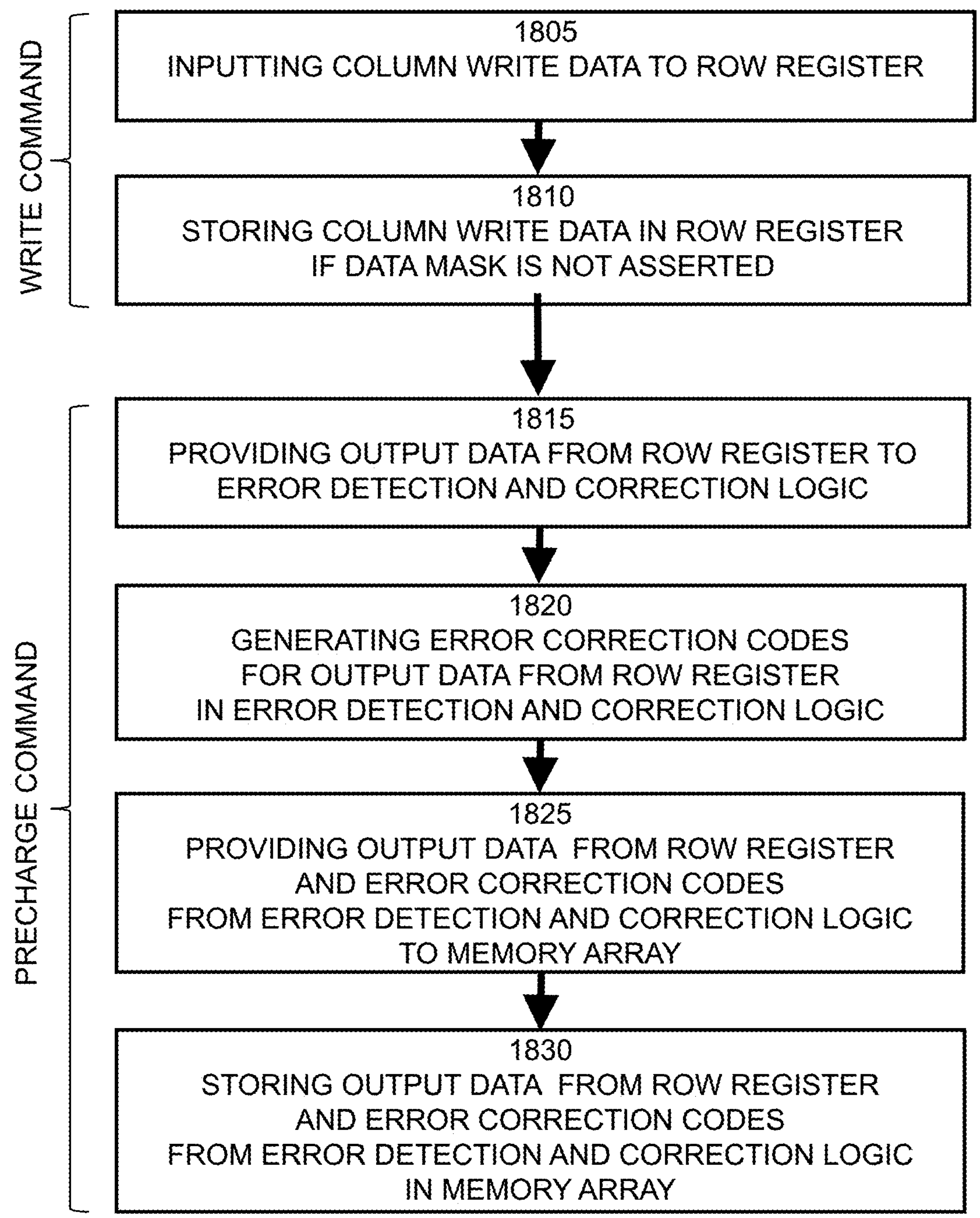
FIG. 18 is a write flow chart for a single chip 512 Mb DDR3L memory which includes on-chip EDAC logic configured in accordance with one embodiment of the present disclosure.

FIG. 18 is a simplified write data flow chart 1800 for a single chip memory which includes on-chip EDAC logic. These steps correspond to the block diagram device components of FIG. 10B. Steps for radiation hardened synchronous DRAM data writing comprise WRITE command steps and PRECHARGE command steps. WRITE command steps comprise inputting column write data to row register (1002) 1805; and storing column write data in row register (1002) if data mask is not asserted 1810. PRECHARGE command steps comprise providing output data from row register (1002) to error detection and correction logic (1006) 1815; generating error correction codes for output data from row register in error detection and correction logic 1820; providing output data from row register (1002) and error correction codes from error detection and correction logic (1006) to memory array (402) 1825; and storing output data from row register (1002) and error correction codes from error detection and correction logic in memory array (402) 1830. These steps are compatible with JEDEC specifications for SDRAM.

Figure 19:
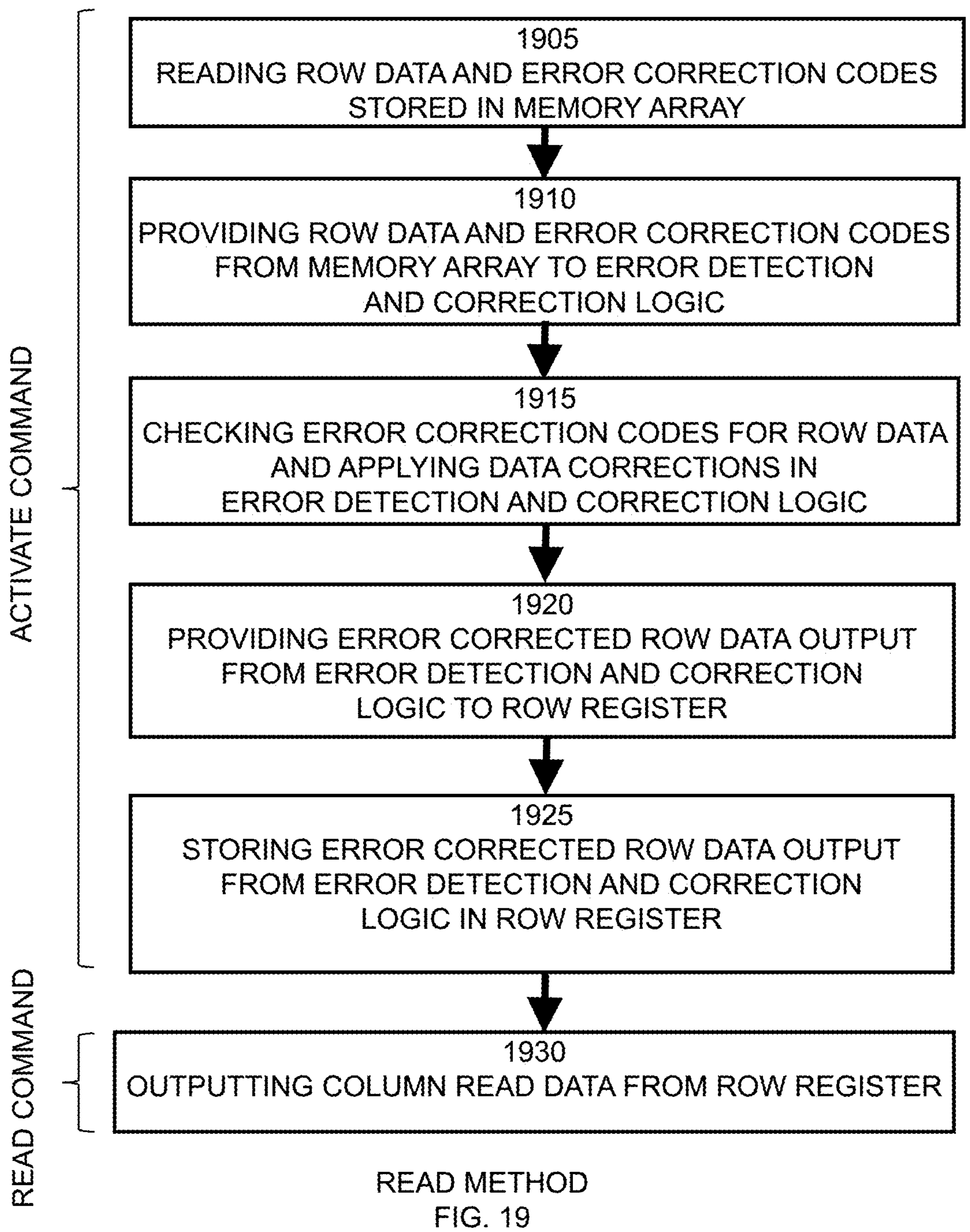
FIG. 19 is a read flow chart for a single chip 512 Mb DDR3L memory which includes on-chip EDAC logic configured in accordance with one embodiment of the present disclosure.

FIG. 19 is a simplified read data flow chart 1900 for a single chip memory which includes on-chip EDAC logic. These steps correspond to the block diagram device components of FIG. 10B. Steps for radiation hardened synchronous DRAM data reading comprise ACTIVATE command steps and READ command steps. ACTIVATE command steps comprise reading row data and error correction codes stored in memory array (402) 1905; providing row data and error correction codes from memory array (402) to error detection and correction logic (1006) 1910; checking error correction codes for row data and applying data corrections in error detection and correction logic (1006) 1915; providing error corrected row data output from error detection and correction logic (1006) to row register (1002) 1920; and storing error corrected row data output from error detection and correction logic (1006) in row register (1002) 1925. The read command step comprises outputting column read data from row register (1002) 1930. As with FIG. 18, these steps are compatible with JEDEC specifications for SDRAM.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A radiation hardened synchronous Dynamic Random Access Memory (DRAM) device, comprising:

a plurality of Static Random Access Memory (SRAM) cells forming a SRAM array;

a plurality of bit registers configured with each of the plurality of SRAM cells in the SRAM array;

a first column multiplexer configured to select which of said bit registers in the SRAM array is accessed;

Error Detection And Correction (EDAC) logic implemented in each memory bank of the DRAM, wherein the EDAC is configured to perform an Error Correction Code (ECC) check during a READ burst and generate an ECC result during a WRITE burst for SRAM writeback during a PRECHARGE command; and a second column multiplexer wherein an accessed byte within the WRITE burst or a READ burst is selected from the selected bit registers of the first column multiplexer.

2. The device of claim 1, wherein the EDAC logic comprises Single Error Correct/Double Error Detect (SEC/DED) logic implemented on-chip in each said memory bank.

3. The device of claim 1 wherein each said memory bank incorporates said bit register and Single Error Correct/Double Error Detect (SEC/DED) logic.

4. The device of claim 1 further comprising emulation logic constructed using a combination of commercial logic cells and radiation hardened sequential logic elements.

5. The device of claim 1 wherein said SRAM cells are partitioned into logical banks, each further partitioned into subarrays, thereby reducing active power consumption.

6. The device of claim 1 wherein each bit of said bit registers comes from a unique SRAM instance, whereby multiple bit errors are reduced.

7. The device of claim 1 further comprising:
a Joint Test Action Group/Memory Built-In Self Test comprising inputs of TCLK, TMS, TRST_L, TDI, and TDO output, and MBIST engines output.

8. The device of claim 1 wherein said second column multiplexer comprises:
a Read Modify Write (RMW) multiplexer receiving an input from a DATA multiplexer and First In First Out (FIFO) buffer and an input from a Data Mask (DM) multiplexer and FIFO.

9. The device of claim 1 wherein bits are 'twisted' 90 degrees between said SRAM array and a page register array.

10. The device of claim 1 wherein said device complies with a JEDEC JESD79-4B standard defining a DDR3L SDRAM specification.

11. A method for radiation hardening synchronous Dynamic Random Access Memory (DRAM) memory banks wherein Error Detection And Correction (EDAC) is implemented on each of said memory banks on a single chip, the method comprising:
providing a plurality of interleaved Static Random Access Memory (SRAM) cells, wherein all logical columns for a single data bit are physically adjacent, abutting along a row, whereby said chip is less susceptible to multiple bit upsets (MBU) caused by a single charged particle due to maximum physical separation between bits in a same data word, wherein memory cells within a same data word are separated by a number of physical cells equal to a number of logical columns;
providing a plurality of instances of bit registers configured to interface with said plurality of interleaved SRAM cells;
providing a first column multiplexer configured to select which of said bit registers is accessed;
providing Error Detection and Correction (EDAC) logic, configured to check Error Correction Code (ECC) during a READ burst and generate ECC during a WRITE burst for SRAM writeback during a PRECHARGE command; and
providing a second column multiplexer wherein an accessed byte within the WRITE burst or the READ burst is selected from the selected bit registers of the first column multiplexer.

12. The method of claim 11, wherein each bit of said bit registers comes from a unique SRAM instance whereby multiple bit errors are reduced.

13. The method of claim 11, further comprising writing, comprising:
inputting data to the second column multiplexer;
providing an output of the second column multiplexer which is then provided to a first Pipeline Register; and
providing the output of the first Pipeline Register to ECC Generation Logic.

14. The method of claim 11, further comprising writing, comprising:
providing an output of ECC Generation Logic to a second Pipeline Register; and
providing the output of the second Pipeline Register to the first column multiplexer.

15. The method of claim 11, further comprising writing, comprising:
providing an output of the first column multiplexer to the plurality of bit registers; and
providing the output of the bit registers to the SRAM Array.

16. The method of claim 11, wherein read steps comprise:
outputting data from the SRAM array to the bit registers; and
outputting the bit registers to the first column multiplexer.

17. The method of claim 11, further comprising reading, comprising:
providing an output of the first column multiplexer to a second Pipeline Register; and
providing an output of the second Pipeline Register to the EDAC logic.

18. The method of claim 11, further comprising reading, comprising:
providing an output of the EDAC logic to a first Pipeline Register; and
providing an output of the first Pipeline Register to the second column multiplexer.

19. The method of claim 11, further comprising reading, comprising:
providing read data from an output of a first pipeline register to the second column multiplexer and outputting data from the second column multiplexer.

20. A system for radiation hardening synchronous Dynamic Random Access Memory (DRAM) memory cell banks wherein Error Detection And Correction (EDAC) is implemented on-chip in each bank, the system comprising:
synchronous DRAM data writing comprising:
inputting data to a second column multiplexer;
providing output of the second column multiplexer to a first Pipeline Register;
providing output of the first Pipeline Register to Error Correction Code (ECC) Generation Logic;
providing output of the ECC Generation Logic to a second Pipeline Register;
providing output of the second Pipeline Register to a first column multiplexer;
providing output of the first column multiplexer to a plurality of bit registers;
providing output of the bit registers to a SRAM Array; and
ending write data flow at the SRAM Array; and
synchronous DRAM data reading comprising:
outputting data from the SRAM Array to the plurality of the bit registers;
outputting from the plurality of bit registers to the first column multiplexer;
outputting from the first column multiplexer to the second Pipeline Register;
providing output from the second Pipeline Register to EDAC Logic;
providing EDAC Logic output to the first Pipeline Register;
providing the first Pipeline Register output to the second column multiplexer; and
outputting data from the second column multiplexer.

* * * * *